(12) United States Patent  
Brughmans et al.

(10) Patent No.: US 7,542,887 B2  
(45) Date of Patent: Jun. 2, 2009

(54) METHOD AND SYSTEM FOR DYNAMIC ANALYSIS OF COMPLEX SYSTEMS

(75) Inventors: Marc Brughmans, Korbeek-Lo (BE); Peter Mas, Kortenaken (BE); Rabah Hadjit, Colfontaine (BE); Eike Brechlin, Stuttgart (DE); Stijn Donders, Kessel-Lo (BE)

(73) Assignee: LMS International NV, Leuven (BE)

( * ) Notice: Subject to any disclaimer, the term of this patent is extended or adjusted under 35 U.S.C. 154(b) by 209 days.

(21) Appl. No.: 11/403,852

(22) Filed: Apr. 14, 2006

(65) Prior Publication Data

US 2006/0259283 A1     Nov. 16, 2006

(30) Foreign Application Priority Data

Apr. 15, 2005   (GB)  ................. 0507618.7

(51) Int. Cl.  
*G06F 17/10* (2006.01)
(52) U.S. Cl. ............................. 703/2; 703/6
(58) Field of Classification Search ............. 703/2, 703/6, 7  
See application file for complete search history.

(56) References Cited

U.S. PATENT DOCUMENTS

| 5,901,072 A | 5/1999 | Shimmell |
| 6,077,302 A | 6/2000 | Kumra et al. |

FOREIGN PATENT DOCUMENTS

WO   WO 2004/027583 A2   4/2004

OTHER PUBLICATIONS

Chung et al., "A General Procedure for Finite Element Model Check and Model Identification" [online], 1995, McDonnell Douglas, MSC 1995, World Users' Conference Proceedings. Available from: http://www.mscsoftware.com/support/library/conf/wuc95/p03895.pdf (Accessed Jun. 21, 2005).  
D.M. Tran, "Component mode synthesis methods using interface modes. Application to structures with cyclic symmetry", Computers and Structures 79 (2001), pp. 209-222.  
Etienne Balmés, "Use of Generalized Interface Degrees of Freedom in Component Mode Synthesis", IMAC, 1996, pp. 204-210.  
Castanier et al., "Characteristic Constraint Modes for Component Mode Synthesis", AIAA Journal, vol. 39, No. 6, Jun. 2001, pp. 1182-1187.  
Mizuho Inagaki et al, "Prediction of Structural and Kinematic Coupled Vibration on Internal Combustion Engine", pp. 27-33, R&D Review of Toyota CRDL, vol. 37, No. 2, XP-002398442.  
M. Just et al, "Microgravity Disturbance Predictions in the Combustion Integrated Rack", Oct. 10-19, 2002, pp. 1-8, 53$^{rd}$ International Astronautical Congress, Houston, Texas, XP-0023984423.

*Primary Examiner*—Russell Frejd  
(74) *Attorney, Agent, or Firm*—Bacon & Thomas, PLLC

(57) ABSTRACT

Methods for performing a dynamic analysis of complex systems are described. The dynamic analysis of complex systems is performed by sub-structuring of the system into a plurality of sub-structures. The sub-structures and the interfaces between the sub-structures are modelled using a generalized eigenvector analysis of a discretized model of a full system or a subassembly thereof comprising at least two sub-structures. The sub-structures then are combined at the interfaces into a combined system. The combined system then is solved. Optionally, selected sub-structures may be reduced. Performing such a dynamic analysis allows studying characteristics such as e.g. vibration and/or acoustical effects in a computational efficient way. Such methods can be applied for optimizing designs of such complex systems.

24 Claims, 23 Drawing Sheets

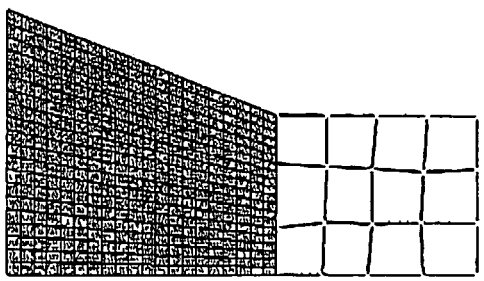
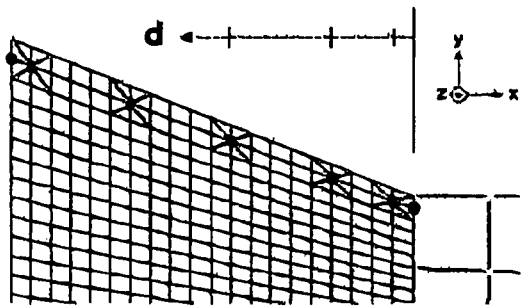
Fig. 8a  Fig. 8b
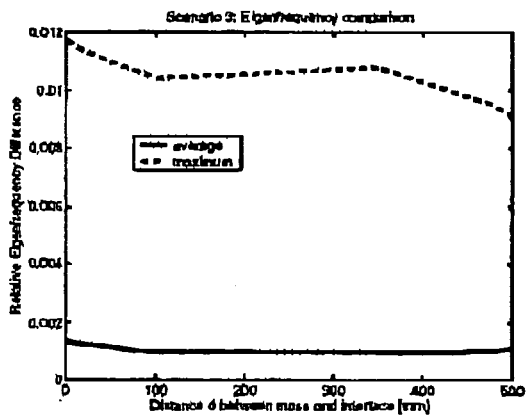
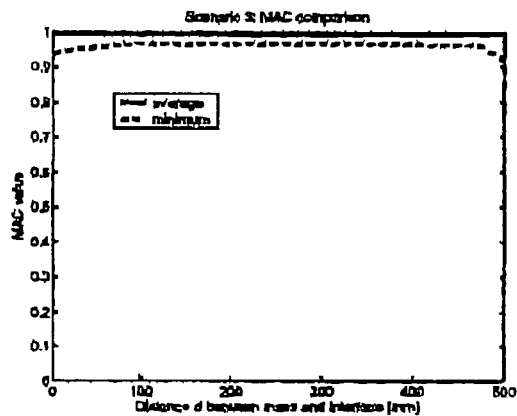
Fig. 8c  Fig. 8d
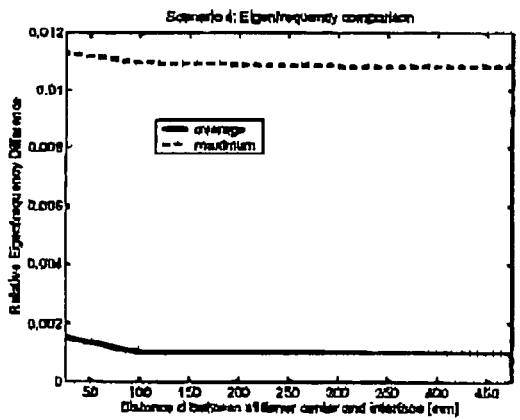
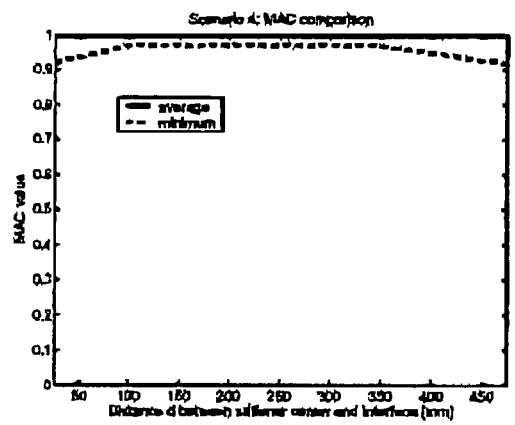
Fig. 8e  Fig. 8f

Fig. 9b  Fig. 9c

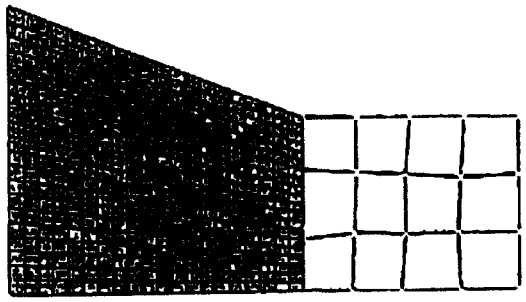 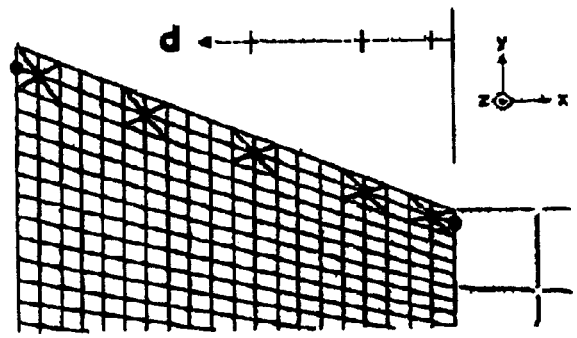
Fig. 8a  Fig. 8b

METHOD AND SYSTEM FOR DYNAMIC ANALYSIS OF COMPLEX SYSTEMS

TECHNICAL FIELD OF THE INVENTION

The present invention relates to Computer-Aided Engineering (CAE) and in particular to Computer-Aided Engineering (CAE) methods and apparatus for studying physical properties of a system. The physical properties of a system can e.g. be the acoustic and/or vibration behaviour of a system.

BACKGROUND OF THE INVENTION

Vibration effects and acoustic performance of manufactured products, such as for example, but not limited to, transportation means, has become a very important aspect in the design and development process of new products, not only to improve the comfort of the user of the product, e.g. passengers in a car or in an aircraft, but also to reduce the nuisance to the surroundings, e.g. for habitations close to highways or to an airport. The additional trend of mass customisation furthermore forces engineers to evaluate and design a higher number of transportation means variants on a lower number of platforms. The design decisions therefore are based more and more on virtual prototypes, such that the time-to-market as well as the economical cost can be reduced. The latter results in increase of importance of fast assembly predictions.

Many assembly prediction methods are based on sub-structuring procedures, as these aim at reducing the size and subsequent computational cost of an original discretised model of an assembly or complex system. Using sub-structuring, the system is divided into sub-structures, corresponding sub-structure models are condensed separately and the condensed sub-structure models are coupled back together into a reduced system model. The quality of the performance of a sub-structuring method thereby typically is the balanced result between the accuracy loss due to the sub-structure model condensation and the gain in computational efforts due to the model size reduction. Well known sub-structuring methods for studying acoustic and/or vibration properties of complex systems are e.g. Component Mode Synthesis (CMS) and Statistical Energy Analysis (SEA). Whereas CMS is based on quantities such as force and displacement, SEA is an energy-based analysis method directed on providing expected results for energy-related information. The present invention will be oriented to CMS.

Using CMS, a system typically is modelled as an assembly of component sub-structures, also called sub-systems, that interconnect to each other, whereby the substructures typically first are dealt with independently by transforming the physical degrees of freedom (DOFs) of each sub-structure model into a reduced number of so-called generalised co-ordinates, the columns of the transformation matrix used being referred to as Ritz vectors or component modes. Thereafter, the reduced sub-structure models are coupled together by expressing the equations of compatibility and/or continuity between the sub-structures. The degrees of freedom, i.e. the unknowns, of the reduced system model consist of internal degrees of freedom of the sub-structures and interface degrees of freedom, defined at the interfaces between the sub-structures. Typically information about the behaviour of the degrees of freedom at the interface as well as the internal degrees of freedom needs to be known for each component A well-established and widely used CMS variant is the Craig-Bampton method, which uses normal modes of the components as Ritz vectors, whereby the interface degrees of freedom (DOFs) are assumed to be fixed. In order to keep the computational effort significantly small the basis functions, used to express the interface degrees of freedom, thereby are based on a statically reduced system model. By way of illustration, some examples of sub-structuring methods based on CMS are provided.

In Computers and Structures 79 (2001) 209, Tran describes a method for reducing the number of interface co-ordinates in a component mode synthesis method. The method is based on the use of a truncated basis of interface modes instead of the constraint modes and is illustrated for both free and hybrid interface methods. The obtained basis thereby is determined based on a statically reduced system model.

In proceedings of IMAC 96 (1996) 204, Balmès describes a CMS sub-structuring method whereby solutions for a complex system are obtained in a reduced sub-space corresponding to a reduction basis described by reduced DOFs. The difficulty is to choose the reduction basis such that for the qualities of interest similar results are obtained as for full models. Balmès uses interface displacement continuity conditions as generalised kinematic boundary conditions and interface force equilibrium conditions for model reduction through static condensation.

In the American Institute of Aeronautics and Astronautics Journal 39 (2001) 1182, Castanier et al. describe a technique for reducing the size of a model generated by a Craig-Bampton method. The method is based on performing an eigenanalysis on the constraint-mode partitions of the mass and stiffness matrices that correspond to the Craig-Bampton constraint modes. The method seems especially suited to predict power flow in complex structures.

Although the above mentioned papers have reported on the use of some sort of component modes as interface basis functions, further optimisation of the efficiency of the sub-structuring methods used for optimisation of designs still is needed, allowing efficient sub-structuring of (more) complex systems.

SUMMARY OF THE INVENTION

It is an object of the present invention to provide a system and method for efficiently studying the dynamic analysis of complex systems. Such system and method can be e.g. advantageously used for optimising the acoustic and/or vibrational behaviour of complex systems.

The above objective is accomplished by a method and device according to the present invention. The invention relates to a method for performing dynamic analysis of a system, the method comprising sub-structuring of said system into a plurality of sub-structures, modelling said sub-structures into sub-structure models and modelling interfaces between said sub-structure models, combining said sub-structure models at the interfaces into a combined system and solving the combined system, wherein said modelling comprises performing a dynamic analysis on a discretised model of at least a subassembly of at least two sub-structures. The latter allows to obtain an efficient system. The computational time needed, e.g. in a modification and/or optimisation study of a complex system, can significantly be reduced.

For any of the embodiments of the present invention the system to be analysed can be a mechanical system involving stationary or moving parts. e.g. may be an automotive vehicle.

Performing a dynamic analysis may comprise obtaining a basis of interface basis functions of said discretised model of at least a subassembly of at least two substructures. Said dynamic analysis consists typically of a normal modes analysis, but it may consist also of any other type of generalised eigenvector analysis (e.g. complex modes analysis, ... ) or of any type of dynamic response analysis. Said obtaining a basis of interface basis functions may comprise orthogonalising eigenvectors related to the interfaces between said substructure models, said eigenvectors being eigenvectors of said at least a subassembly of at least two substructures. Said obtaining a basis of interface basis functions furthermore may comprise, after said orthogonalising eigenvectors, selecting a number of orthogonalised eigenvectors that accurately represents the space determined by said eigenvectors related to the interfaces between said substructure models. Said selecting may comprise selecting orthogonalised eigenvectors having a singular value above a predetermined threshold. The latter typically is done in case of singular value decomposition. The threshold thereby is an absolute or relative threshold on singular value decomposition.

Said dynamic analysis may be based on an element-based method. Said element-based method may be a finite element method.

Said dynamic analysis may be based on force and/or displacement related quantities.

Said dynamic analysis of a system may comprise analysis of the vibration and/or acoustical properties of said system.

The at least a subassembly of at least two substructures may comprise the full system.

Modelling said interfaces may comprise constraining said substructure interfaces by expressing substructure interface degrees of freedom as linear combination of said interface basis functions.

The method furthermore may comprise, prior to said combining, reducing said substructure model. Said reduction step involves reduction of the number of degrees of freedom of the substructure model. Any type of component mode synthesis procedure can be applied for said substructure model reduction. The efficiency of said reduction step may be enhanced due to the reduced number of interface degrees of freedom by using of said interface basis functions. Said reduction step may utilise enrichment vectors defined by a static or dynamic deformation of a system or model thereof as a consequence of a force excitation and/or an enforced deformation of part of said system. For instance, said reduction step may comprise the calculation of residual flexibility modes, defined by a deformation due to a unit force exerted on a participation factor, said participation factor defined by a coefficient in said linear combination of said interface basis functions.

The invention also relates to a method for tuning functional characteristics of a physical system, the method comprising obtaining a design of said physical system, performing a method for dynamic analysis of said design of said physical system according to any of the methods as described above and extracting physical information about the functional characteristics of said design of said physical system.

The method furthermore may comprise altering said design of said physical system, constructing a mathematical model of said altered design of said physical system, said mathematical model at least partly based on said dynamic analysis of said design and extracting, from said mathematical model of said altered design of said physical system, physical information about the functional characteristics of said altered design of said physical system.

Said mathematical model at least partly based on said dynamic analysis of said design may be a mathematical model based on the same generalised eigenvector analysis of said discretised model of at least a subassembly of at least two substructures, e.g. a normal mode analysis.

Said mathematical model at least partly based on said dynamic analysis of said design may be a mathematical model based on the same basis of interface basis functions.

Said functional characteristics of said physical system may be vibration and/or acoustic properties of said physical system.

The invention also relates to a computer program product for executing any of the methods as described above. The invention furthermore relates to a machine readable data storage device storing said computer program product. The invention also relates to transmission of said computer program product over a local or wide area telecommunications network.

The invention furthermore relates to a computer system for performing dynamic analysis of a system, the system comprising a sub-structuring means adapted for sub-structuring of said system into a plurality of sub-structures, a modelling means adapted for modelling said sub-structures into substructure models and modelling interfaces between said substructure models, a combining means for combining said sub-structure models at the interfaces into a combined system and a solving means for solving the combined system, said modelling means furthermore being adapted for performing a generalised eigenvector analysis on a discretised model of at least a subassembly of at least two sub-structures, e.g. a normal modes analysis.

Particular and preferred aspects of the invention are set out in the accompanying independent and dependent claims. Features from the dependent claims may be combined with features of the independent claims and with features of other dependent claims as appropriate and not merely as explicitly set out in the claims.

It is an advantage of embodiments of the present invention that the method can be applied for any mathematical model that comprises second-order time derivatives (and spatial derivatives of arbitrary order) or for any combination of such mathematical models.

It is also an advantage of embodiments of the present invention that it allows to significantly speed up the calculation process, whereby only a slight loss of accuracy occurs in comparison to direct solution sequences without sub-structuring or to other sub-structuring methods.

It is an advantage of embodiments of the present invention that any discontinuity of physical quantities allowed in said mathematical model or combination of mathematical models of the system is preserved in the sub-structuring procedure.

It is furthermore an advantage of embodiments of the present invention that the sub-structures may have incompatible meshes along their interfaces.

It is an advantage of embodiments of the present invention that a high number of various designs can be tested in an efficient way, allowing an efficient optimisation of complex systems.

Although there has been constant improvement, change and evolution of devices in this field, the present concepts are believed to represent substantial new and novel improvements, including departures from prior practices, resulting in the provision of more efficient, stable and reliable devices of this nature.

The teachings of the present invention permit the design of improved methods and systems for performing a dynamic analysis of a complex system and improved methods and systems for optimising the acoustic and/or vibration behaviour of complex systems.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings,

Figure 1:
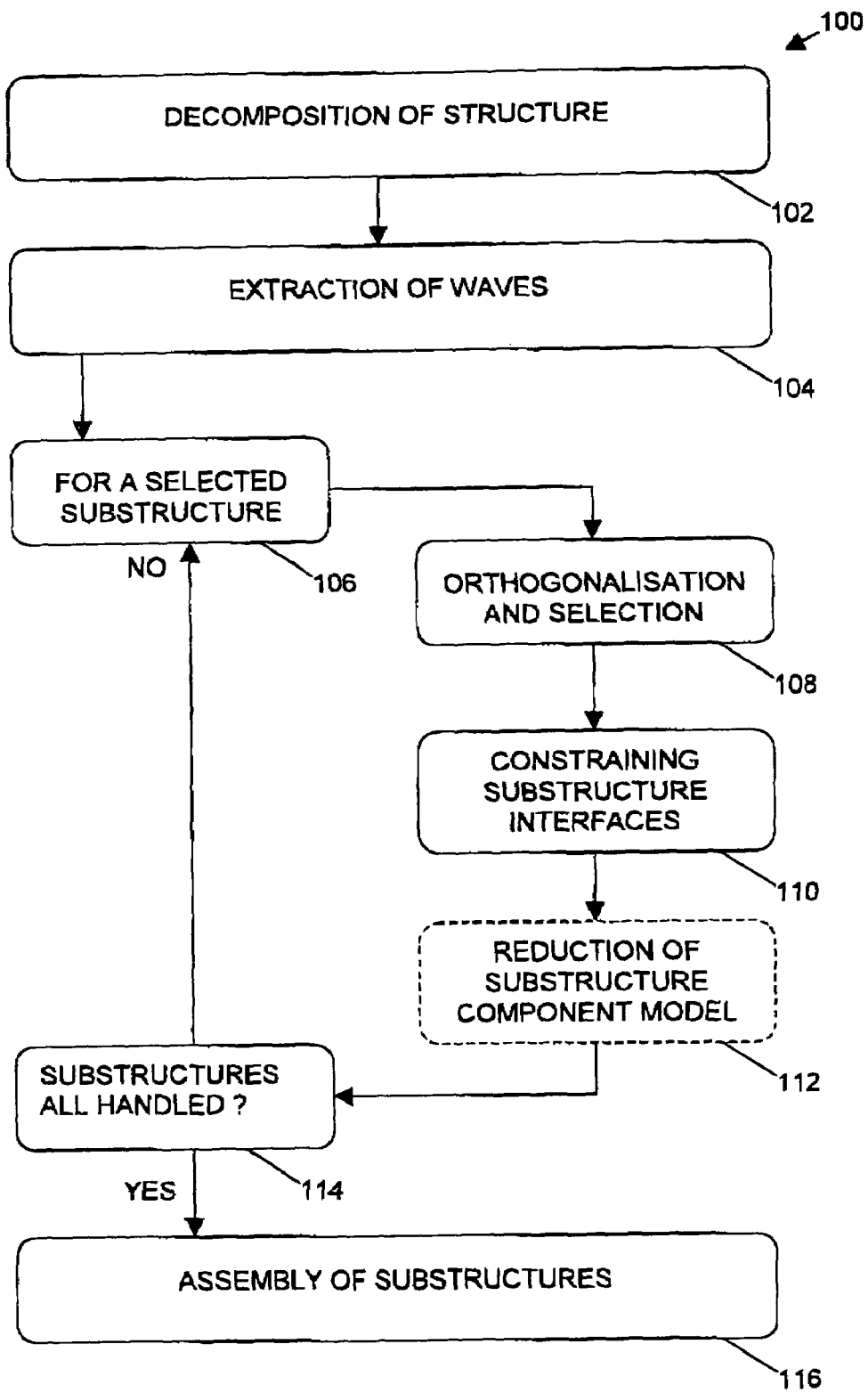
FIG. 1 shows an overview of a method for wave based sub-structuring of complex systems according to the first embodiment of the present invention. This flow chart is given for the sake of example only, without excluding alternative flow charts, based on other practical implementations of the different embodiments of the present invention.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means/steps listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

The present invention relates to methods and systems for efficient wave-based sub-structuring of a complex system. The methods and systems are applicable for discretised models. They can be used e.g. for finite element models. They also can be used e.g. with infinite element methods, direct boundary element methods, etc. or a combination of these methods. The methods and systems thus can be used for element-based methods. By way of illustration, in the present application, the described methods and systems will be based on finite element models, the invention not being limited thereto.

The methods of the present invention can advantageously be applied for any discretised dynamic system model, e.g. involving up to second-order time derivatives or a combination of such models. They can advantageously be used for acoustic, vibration or acoustic-vibration analysis of systems. Other physical properties also may be studied, whereby the system is described by general discretised dynamic models, e.g. the scalar Helmholtz equation, a simplified version of the Maxwell equations, Kirchoff's law, or second order models, etc. It is to be noted that the source of excitation is not limiting for the described methods and systems according to the present invention. The characterising equation describing these effects will be referred to as the system equation. The methods and corresponding systems therefore can advantageously be used in a context of modification analysis and optimisation, wherein various finite element analysis runs are performed, e.g. each for a slightly different design.

By way of illustration, the embodiments of the present invention further will be described for vibration effects in a system, without the invention being limited thereto. The invention thereby is directed towards methods and systems for analysis of complex systems that are based on quantities such as force and displacement. It will be obvious for the person skilled in the art that in case other physical properties are studied whereby the system is described by a discretised dynamic model involving up to second-order time derivatives, the quantities whereon the methods and systems are based need to be replaced mutates mutandis. E.g. for acoustical effects, force will be replaced by velocity and displacement will be replaced by acoustic pressure. The frequency range wherein the method according to the present invention can be used is in principle not limited. For acoustics analysis, the frequency range of importance ranges typically from very low frequencies, e.g. 5 kHz, preferably 1 kHz, more preferably 300 Hz, even more preferably 20 Hz till high frequencies, e.g. 15 kHz, preferably 20 kHz, whereas e.g. for vibration analysis in vehicles the typical frequency range typically extends from 0 Hz up to several kHz. It will be clear that vibration at higher frequencies also can be studied. As a modal based description will be used, it is practically assumed that the system has still a dynamic behaviour in which the influence of distinct modes can be noticed. The latter implies that preferably low-frequency problems, i.e. typically between 0 Hz and 1000 Hz, and mid-frequency problems, i.e. typically between 500 Hz and 4000 Hz, are typically looked at, although the invention is not limited thereto. The absolute frequency values of interest are nevertheless problem dependent. It is to be noted that study of high frequencies, e.g. 20 kHz, is computationally more expensive than study of low frequencies, e.g. 1 kHz. The latter can be explained as follows. With increasing frequency, the numerical dispersion error of element based methods increases. At high frequencies, accurate predictions can only be obtained with a very fine mesh size, i.e. with a very large numerical model, the latter resulting in a high computational cost.

Figure 4:
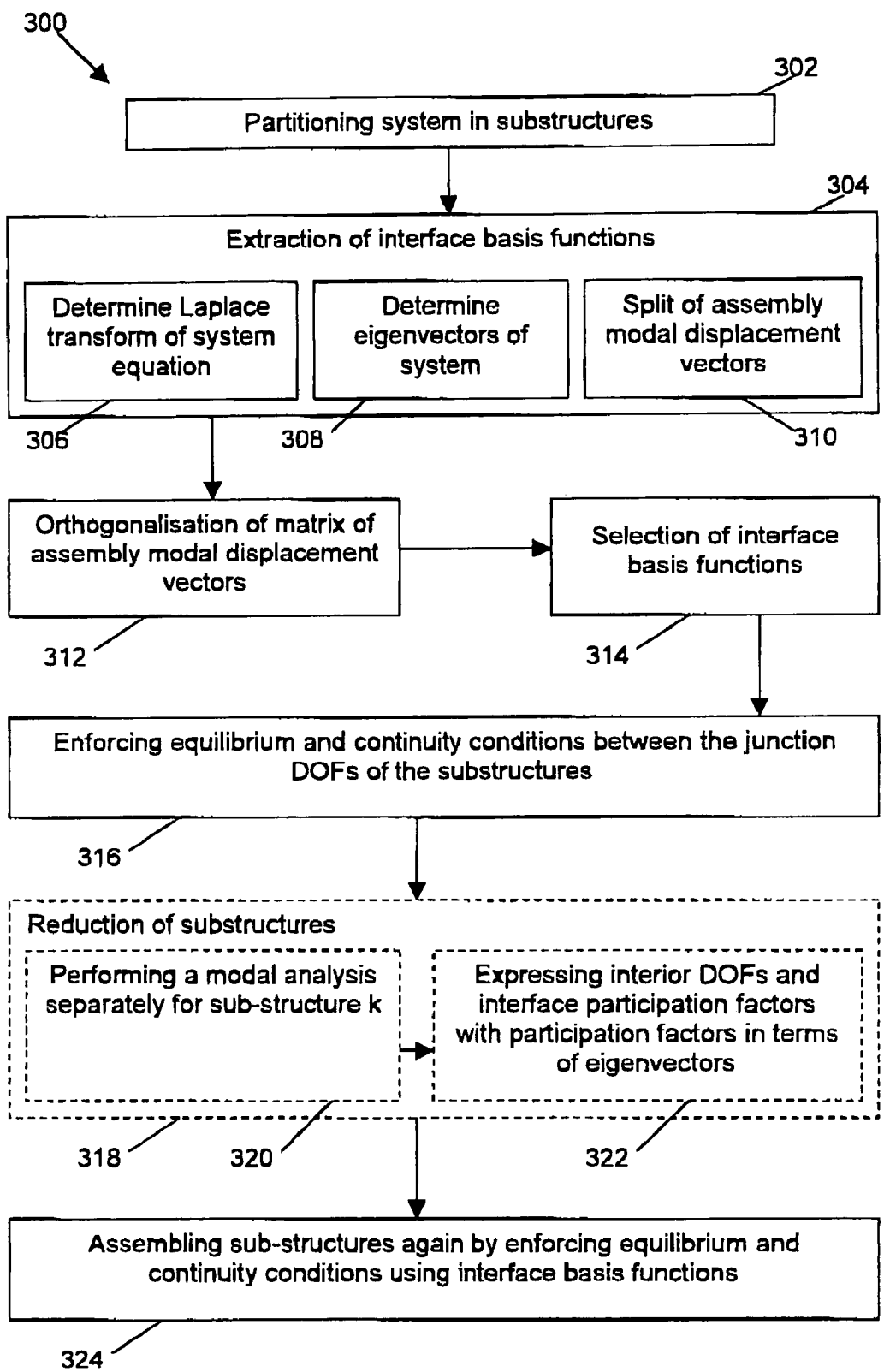
FIG. 4 shows a schematic overview of a method adapted for wave based sub-structuring of complex systems, according to a second embodiment of the present invention. This flow chart is given for the sake of example only, without excluding alternative flow charts, based on other practical implementations of the different embodiments of the present invention.
Figure 5:
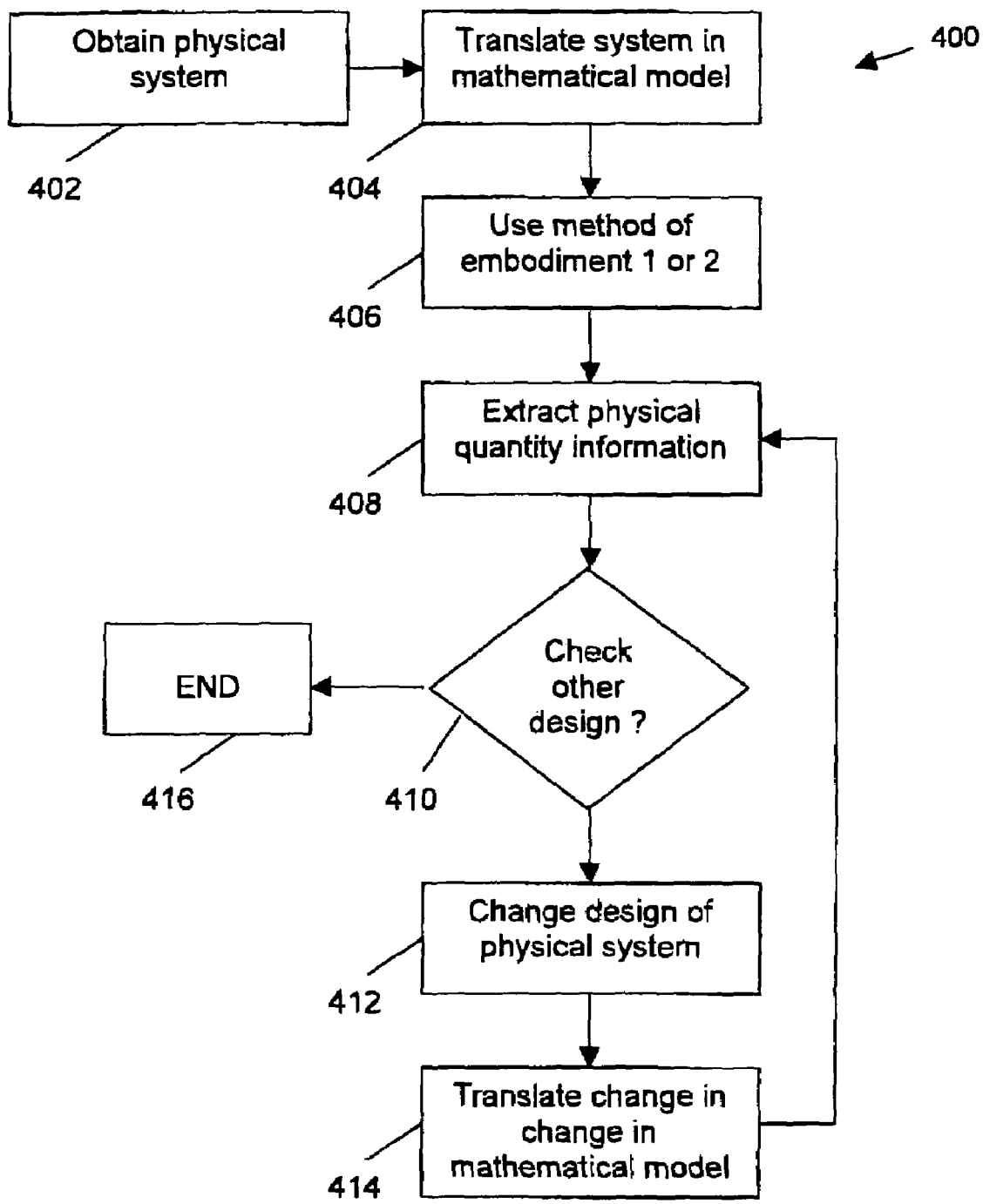
FIG. 5 shows a schematic overview of a method for tuning the functional performance characteristics of a physical system, according to a third embodiment of the present invention. This flow chart is given for the sake of example only, without excluding alternative flow charts, based on other practical implementations of the different embodiments of the present invention.

It should be noted that FIG. 1, FIG. 4 and FIG. 5 represent possible flow charts of a practical implementation of the different embodiments of the present invention. These flow charts are given for the sake of example only, without excluding alternative flow charts, based on other practical implementations of the different embodiments of the present invention.

Figure 2:
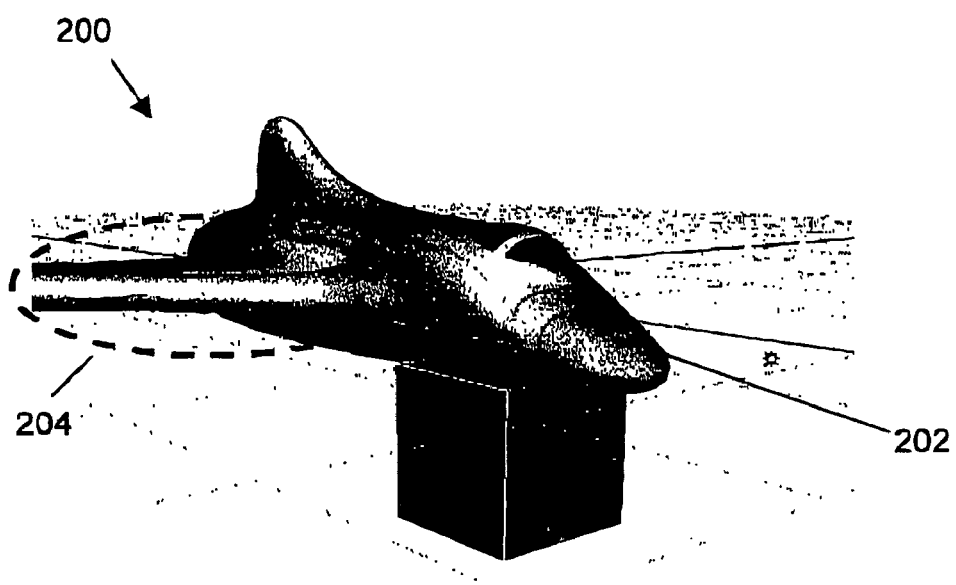
FIG. 2 shows a complex system comprising a number of sub-structures which can be sub-structured according to embodiments of the present invention.
Figure 3:
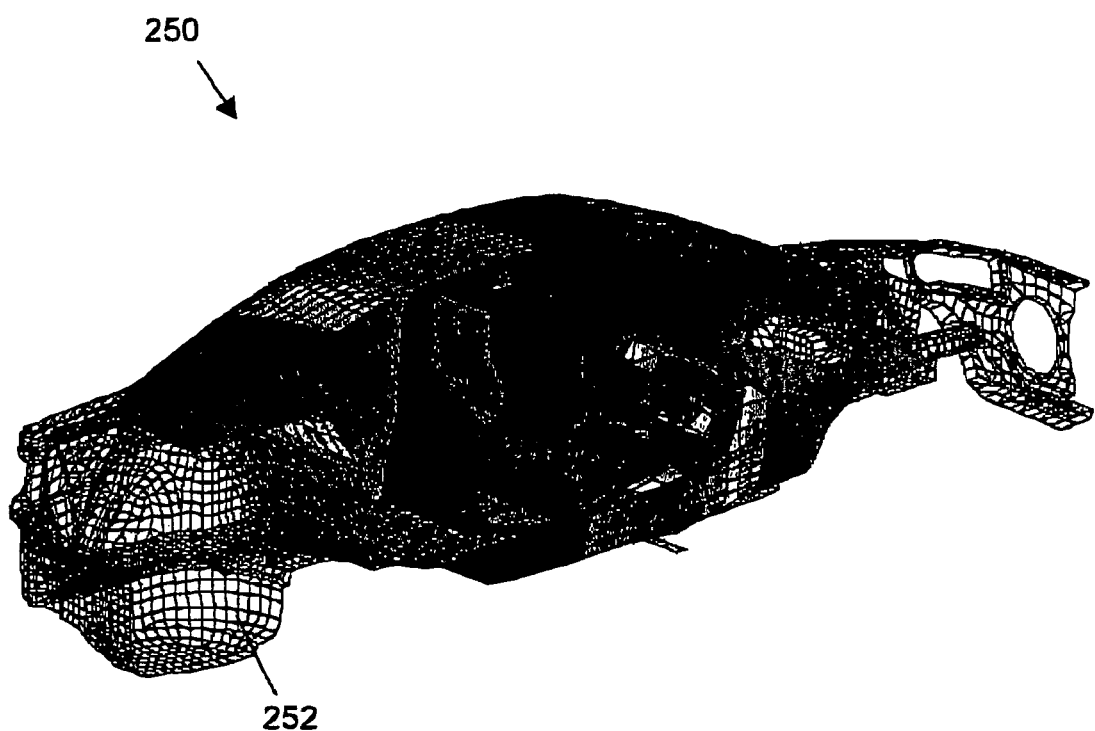
FIG. 3 shows a discretised element model of a complex system according to embodiments of the present invention.

In a first embodiment, the present invention relates to a method for efficient wave sub-structuring in the dynamic analysis of complex systems. The method 100 comprises a number of steps, which by way of illustration are shown in the flow chart of FIG. 1. The different objects used while performing the method for studying properties of a spacecraft are described in FIG. 2. It is to be noted that the latter is only provided by way of illustration, the invention not being limited thereto. In a first step 102, the original system 200 is decomposed into two or more sub-structures 202. The term substructure 202 thereby can be defined as a part of the system 200 or a physical element of the system 200. In a second step 104, extraction of the interface basis functions is performed. The interface basis functions also may be referred to as waves. The interface basis functions thereby are defined through a generalised eigenvector calculation on the original discretised model for the complete system 200 or of a complete subassembly 204 of the system 200 comprising at least two sub-structures 202. Normal modes analysis is a typical example of a generalised eigenvector analysis. Normal modes thereby are characteristic deformation patterns of a dynamic system, in which all parts of the system are vibrating at the same frequency, being the resonance frequency associated with the normal mode. Each system has as many normal modes as it has degrees of freedom. It is to be noted that the interface basis functions thus are not determined based on a statically reduced model for the complete system 200 or a statically reduced model of a subassembly 204 of the system 200. The extraction of interface basis functions is typically performed from a single dynamic finite element analysis of the complete system 200 or a complete subassembly of the system. In other words, the interface basis functions result from a generalised eigenvector calculation on a discretised model for the complete system or at least a complete subassembly of the system (, not on a statically reduced system model. For example a normal modes analysis may be used. If in prior art global normal modes are used, these are typically obtained from a reduced eigenvalue problem, e.g. an eigenvalue problem associated with a statically reduced system model, not from a discretised dynamic model of the complete system or of at least a complete subassembly of the system. The latter will imply that a dynamic analysis will have to be performed for the complete system or a complete subassembly of the system. An example of a finite element mesh 250 of a complex system with nodes 252 is shown in FIG. 3, for an exemplary object, in the present example being a car, the invention not being limited thereto. FIG. 3 thus shows a discretised, i.e. element-based, model of a complex system combining a structural finite element model and an acoustic boundary element model. The output of this step thus typically comprises all interface basis functions. The method then proceeds to a third step 106, which is the initial step of a loop wherein for each substructure a number of steps is performed. It is to be noted that the number of substructures in principle is not limited. The number of substructures may be at least one. The system thus may have only one substructure, the substructure then being identical to the structure, Alternatively, a larger number of substructures, typically in a range having a lower limit 2 and a higher limit of several thousands of sub-structures, or even several ten thousands of sub-structures or even more sub-structures may be used. It also is to be noted that the orthogonalisation and selection of the interface basis functions may be performed on structure level and further steps of constraining and optional reduction may be performed on sub-structure level, i.e. for selected sub-structures.

In a fourth step 108, orthogonalisation and selection of the interface basis functions, i.e. waves, is performed for the selected sub-structure. It should be noted that the orthogonalisation does not necessarily have to be performed on a substructure level, but might be done in a single global system level procedure. In any case, the orthogonalisation is a post-processing step for the extraction step 104. An orthogonal set of interface basis functions is needed as a basis for the interface displacements of the selected sub-structure. In order to perform this orthogonalisation and selection typical processing techniques such as e.g. QR decomposition or singular value decomposition (SVD) can be used, although the invention is not limited thereto. Selection of the most relevant interface basis functions may e.g. be performed by selecting specific eigenvectors of the orthonormal basis. The latter results in a set of selected orthogonal interface basis functions for the substructure. In a fifth step 110, the sub-structure interfaces are constrained. The latter may e.g. be obtained by applying a constraint relation on the sub-structure interface, such that the interface degrees of freedom can be expressed as a linear combination of the waves. In other words, constraining the interface degrees of freedom into an admissible interface basis function expansion, i.e. as a function of the selected orthogonal interface basis, is performed. In a sixth step 112, reduction of the sub-structure component model of the selected sub-structure is performed. It is to be noted that this step 112 is optional, as not all sub-structure models need to be reduced. In principle none of the sub-structures should be reduced. Often at least the largest sub-structure model is reduced. Typically, in a designing process, only the sub-structure that will be modified in a later design stage remains unreduced, while all other sub-structures are reduced. When the number of wave functions is much smaller than the original number of interface degrees of freedom, a substantial (additional) model size reduction for the substructure model is obtained. If the selected substructure is not reduced, the substructure model stays a full finite element model. If reduction is performed, modal analysis on the sub-structure is performed. Different methods for reduction can be performed, the invention not being limited by the specific choice of reduction method. In the seventh step 114 it is decided whether all substructures are handled. If this is not the case, the method returns to step 106 and proceeds handling a further sub-structure. If all sub-structures are handled, the method proceeds to step 116, wherein an assembly of the sub-structures is performed. The assembly between sub-structures may be either a rigid or an elastic coupling case. As a result of the assembly a complete, reduced model is obtained. It is to be noted that three types of assembly combinations thereby can be present, i.e. coupling between two reduced models, coupling between two non-reduced models or coupling between a reduced and a non-reduced model.

The above-described method in other words allows reducing the size of the interface description in the assembly. It is based on writing the interface displacements as a linear combination of a set of interface basis functions, also referred to as "waves", obtained from a discretised model of the complete system or of a subset of at least two substructures in the system. In other words, the interface degrees of freedom are further condensed by expressing the interface degrees of freedom as a linear combination of admissible interface basis functions, also referred to as 'waves'. Therefore, the above method may be called wave-based sub-structuring. The connection is then defined as relations between the waves, instead of as conventional point-to-point connections. It is to be noted that, for the above-described method, the various interface functions need to be linearly independent, as otherwise the procedure will fail due to singularities. As the required number of basis functions is typically much lower than the number of interface DOFs, faster assembly predictions are obtained. The above-described method is very efficient. Surprisingly, although at least a single computation of a discretised dynamic model of the complete system or of at least a complete subassembly of the system to be studied is to be performed for the dynamic analysis of the system, said single computation being computationally expensive, a method for optimising the acoustic and/or vibration properties of complex systems is obtained that is computationally efficient and that allows to obtain a significantly high accuracy, i.e. an accuracy comparable with the accuracy obtained in prior art direct solution sequences without sub-structuring or with other sub-structuring methods. In other words, although said single computation is computationally expensive, the high computational cost of the initial wave function extraction is compensated by the higher efficiency of the subsequent reduced model that is used in a number of finite element runs. This makes the above-described method especially useful in the context of modification analysis and optimisation which involves various FE analysis runs. It is an advantage of the present invention that the interface representation between the components is reduced, as for complex systems the number of substructures significantly increases and consequently the interface problem becomes an increasingly dominant factor.

A more mathematical description of the different steps of the above-described method will now be provided by way of illustration, in reference to FIG. 4, providing a detailed flow chart of an exemplary method 300 according to the first embodiment, the invention not being limited thereto. The explicit mathematical language that can be used to describe the invention can be e.g. matrix-algebra, vector algebra or the corresponding vector space representation, but the invention is not limited thereto. Other ways of performing the computation according to the embodiments of the present invention can be e.g. by applying neural networks. Furthermore, the formulation of the embodiments of the present invention can be done using different mathematical languages in a single description. Concepts introduced by vector algebra can be equally represented using matrix algebra or using the vector space representation and vice versa. The current description of the embodiments of the present invention is, by way of example, done using matrix algebra. In the first step 302, decomposition of the system 200 into sub-structures 202 is performed. The decomposition of the system 200 mathematically is based on the following. If a finite element structure is considered with in total a number N degrees of freedom, the structure 200 may be partitioned into an arbitrary number of sub-structures k (k=a, b, c, ... ), each with a number $N^k$ degrees of freedom. For each sub-structure k, the $N^k$ degrees of freedom (DOFs) $x^k$ can be divided into $N^k_i$ interior degrees of freedom (DOFs) $x^k_i$ and $N^k_j$ junction degrees of freedom (DOFs) $x^k_j$. The junction DOFs $x^k_j$ express the degrees of freedom along which the sub-structures are coupled with other sub-structures. For each sub-structure k, the system matrices, i.e. mass matrix M, damping matrix C, stiffness matrix K, and force vector f, expressing the state of the system, can thus be partitioned into sub-matrices $M^k$, $C^k$, $K^k$ and $f^k$ resulting in a system equation for each sub-structure k.

$$\begin{bmatrix} M^k_{ii} & M^k_{ij} \\ M^k_{ji} & M^k_{jj} \end{bmatrix}\begin{bmatrix} \ddot{x}^k_i \\ \ddot{x}^k_j \end{bmatrix} + \begin{bmatrix} C^k_{ii} & C^k_{ij} \\ C^k_{ji} & C^k_{jj} \end{bmatrix}\begin{bmatrix} \dot{x}^k_i \\ \dot{x}^k_j \end{bmatrix} + \begin{bmatrix} K^k_{ii} & K^k_{ij} \\ K^k_{ji} & K^k_{jj} \end{bmatrix}\begin{bmatrix} x^k_i \\ x^k_j \end{bmatrix} = \begin{bmatrix} f^k_i \\ f^k_j \end{bmatrix} \quad \text{Eq. [1]}$$

or in alternative matrix notation $$[M^k]\ddot{x}^k + [C^k]\dot{x}^k + [K^k]x^k = f^k$$

with $M^k$ the mass submatrix for sub-structure k, $C^k$ the damping submatrix for sub-structure k, $K^k$ the stiffness matrix for sub-structure k, and where $\dot{x}$ and $\ddot{x}$ denote the first-order and second-order time derivatives of x, respectively. Without loss of generality, from here on the undamped case is considered, i.e. with a zero damping matrix C=0, or for each substructure k a zero damping submatrix $C^k$=O. For each sub-structure k, the system equation expressed using a matrix representation is given by equation [2], i.e.

$$\begin{bmatrix} M^k_{ii} & M^k_{ij} \\ M^k_{ji} & M^k_{jj} \end{bmatrix}\begin{bmatrix} \ddot{x}^k_i \\ \ddot{x}^k_j \end{bmatrix} + \begin{bmatrix} K^k_{ii} & K^k_{ij} \\ K^k_{ji} & K^k_{jj} \end{bmatrix}\begin{bmatrix} x^k_i \\ x^k_j \end{bmatrix} = \begin{bmatrix} f^k_i \\ f^k_j \end{bmatrix} \quad \text{Eq. [2]}$$

or in alternative matrix notation $$[M^k]\ddot{x}^k + [K^k]x^k = f^k$$

It is to be noticed that for assembling several sub-structures into a single structure, equilibrium and continuity conditions will be enforced between the junction DOFs of the sub-structures. The latter can e.g. be expressed mathematically as follows. Consider for example the connection between two sub-structures a and b which have $N^a_j$ and $N^b_j$ junction DOFs $x^a_j$ and $x^b_j$ respectively. First, the general flexibility relations (rigid coupling, inertia-less linear elastic coupling, ... ) must be defined for that junction. This can be quantified by means of a general flexibility relation along that junction, given by equation [3]

$$\begin{bmatrix} f^a_j \\ f^b_j \end{bmatrix} = [\hat{K}]\begin{bmatrix} x^a_j \\ x^b_j \end{bmatrix} = \begin{bmatrix} \hat{K}_{aa} & \hat{K}_{ab} \\ \hat{K}_{ba} & \hat{K}_{bb} \end{bmatrix}\begin{bmatrix} x^a_j \\ x^b_j \end{bmatrix} \quad \text{Eq. [3]}$$

where the matrices $\hat{K}$ denote the general flexibility relations between the junction DOFs of the two sub-structures a and b. The size of these matrices follow the number of junction DOFs $N^a_j$ and $N^b_j$; for example the matrix $\hat{K}_{ba}$ has a size $N^b_j \times N^a_j$. When an arbitrary number of k sub-structures must be assembled, relations such as in equation [3] must be defined for all junctions between the sub-structures. One can then assemble all the sub-structures into a single assembly structure, e.g. a single finite element assembly structure, for which the system equation expressed as function of the system matrices, again for the undamped case, are given by equation [4], i.e.

$$M\ddot{x}+Kx=f \quad \text{Eq. [4]}$$

where the N×N matrices M and K denote the global mass and stiffness matrices, respectively, After partitioning of the system into sub-structures, i.e. step 302, extraction of the interface basis functions 304, also referred to as waves, is performed. If a structure that consists of several sub-structures is considered, for which the system matrices are given by system equation [4], in the Laplace domain, where $\ddot{x}$ becomes $p^2x$, this equation of motion becomes $$[p^2M+K]\{X\}=\{f\} \quad \text{Eq. [5]}$$

wherein $\{X\}$ and $\{f\}$ are the Laplace transformed quantities of x and f, and p is the Laplace variable. Using the Laplace transformed equation, obtained in sub-step 306, allows a normal modes analysis of the assembled structure, as defined by equation [4]. In a following sub-step, the eigenvectors of the assembled structure are obtained, i.e. sub-step 308. In the frequency range of interest $[f_{min}, f_{max}]$, again for the undamped case, the $N_R$ real eigenvalues $\lambda_r$ (r=1 ... $N_R$) then are obtained, with their corresponding eigenvectors $\psi_r$, as the solution of the characteristic equation of equation [5], i.e.

$$[\lambda_r^2M+K]\{\psi_r\}=\{f\} \quad \text{Eq. [6]}$$

The number of real eigenvalues $N_r$ typically ranges between 1 and N and is defined by the end-user, who specifies for instance to take only the modes with eigenfrequencies between a user-defined upper frequency threshold $f_{max}$ and a user-defined lower frequency threshold $f_{min}$ or by specifying to use the first $N_r$ modes i.e. the $N_r$ modes with the lowest eigenfrequencies, or who makes any other suitable choice. The eigenvectors $\psi_r$ are also known as 'mode shape vectors', 'modal displacement vectors' or simply 'mode shapes'. The N degrees of freedom x in the structure can be expressed in terms of the eigenvectors $\psi_r$ weighted with participation factors s:

$$x=\psi_r s \quad \text{Eq. [7]}$$

Also within each sub-structure, the $N^k$ degrees of freedom $x^k$ in the sub-structure can be expressed in terms of the eigenvectors $\psi_r^k$, here defined on all substructure DOFs $x^k$, weighted with the same participation factors s:

$$x^k=\psi_r^k s \quad \text{Eq. [8]}$$

It is to be noted that typically all eigenvectors may be used for each substructure, or in other words, there is no specific selection per individual substructure. For each sub-structure, equation [8] can then be partitioned into interior DOFs $x^k_i$, that are interior to this sub-structure, and junction DOFs $x^k_j$, that are shared with one or more sub-structures, as follows $$\begin{bmatrix} x^k_i \\ x^k_j \end{bmatrix} = \begin{bmatrix} \psi_r^{ki} \\ \psi_r^{kj} \end{bmatrix} \cdot s \quad \text{Eq. [9]}$$

Here, $\psi_r^{ki}$ are the eigenvectors evaluated on all interior DOFs $x^k_i$ and $\psi_r^{kj}$ are the eigenvectors evaluated on all junction DOFs $x^k_j$. In other words, the eigenvectors $\psi_r^{kj}$ related to the junctions or interfaces are determined and split off. These eigenvectors $\psi_r^{kj}$ are referred to as the assembly modal displacement vectors as they originate from a generalised eigenvector analysis of the assembled structure and are related to the junction or assembly of the different sub-structures, For example a normal modes analysis may be used. Although an eigenvalue analysis of the complete assembled structure is computationally expensive, the latter will result in a more efficient method of sub-structuring. Alternatively, an eigenvalue analysis of a complete subassembly of the structure can be performed. The subassembly may be an assembly of a number of sub-structures of the system, whereby the subassembly is "complete". In other words, the assembly modal displacement vectors $\psi_r^{kj}$ in the present method are obtained from a generalised eigenvector analysis of the complete system or a complete subassembly thereof. For example a normal modes analysis can be used. Each set of assembly modal displacement vectors $\psi_r^{kj}$, i.e. the modal displacements of the junction DOFs $x^k_j$ of each substructure k, are the input for the following step of the sub-structuring method.

In step 312, orthogonalisation of the assembly modal displacement vectors is performed. The latter is performed in order to be able to select a minimum number of interface basis functions that are independent of each other and that can accurately represent a sufficiently large sub-space of the space spanned by the $N_r$ assembly modal displacement vectors defined for the $N^k_j$ junction DOFs and defined by the matrix $\psi_r^{kj}$ of size $N^k_j \times N_r$, i.e. $N^k_j$ rows and $N_r$ columns. This set of interface basis functions needs to be selected in order to accurately represent the deformations of the junction DOFs $x^k_j$ in terms of the assembly's generalised eigenvectors. Independency of the interface basis functions thereby is required in order to have a well-conditioned problem, e.g. in order to get the boundary deformation from the recombination of the interface basis functions or to get non-degenerated elastic connection matrices between the interface basis functions. A variety of techniques exist and can be used for such an orthogonalisation. Well-established examples, but by no means an exhaustive list, are the QR decomposition and the singular value decomposition (SVD) The latter is explained by way of example into more detail below for the matrix $\psi_r^{kj}$. SVD is a well-established technique to deal with sets of equations or matrices that are either singular or near singular. In its general form, the SVD decomposition of the matrix $\psi_r^{kj}$ (of size $N^k_j \times N_r$, with $N^k_j \geq N_r$) consists of expressing $\psi_r^{kj}$ as the product of three matrices U, $\Sigma$ and $V^T$, i.e.

$$[\psi_r]_{N^k_j \times N_r} = [U]_{N_j \times N^k_j}[\Sigma]_{N^k_j \times N_r}[V]^T_{N_r \times N_r} \quad \text{Eq. [10]}$$

Here, $\Sigma$ contains the singular values of the matrix $\psi_r^{kj}$, and U and $V^T$ are orthogonal vectors, also known as left and right singular vectors, respectively. In the general case that $N^k_j > N^r$, the matrix $\Sigma$ can be partitioned in a square $N_r \times N_r$ diagonal matrix, with the singular values $\sigma_i$ along the diagonal and a zero block matrix $(N^k_j - N_r) \times N_r$. In the special case that $N^k_j = N_r$, the matrix $\Sigma$ is the $N_r \times N_r$ diagonal matrix (with the singular values $\sigma_i$ along the diagonal). In the above-mentioned $N_r \times N_r$ diagonal matrix, one finds the $N_r$ singular values $\sigma_i$ (i=1 ... $N_r$) that are all non-negative and are descending along the diagonal (that is, $\sigma_i \leq \sigma_{i-1}$ for all i=2 ... $N_r$). These singular values allow diagnosing the numerical conditioning of the matrix, in that very low singular values cause numerical problems when the matrix $\psi_r^{kj}$ must be inverted. One approach to improve the numerical conditioning of the matrix is to apply an absolute threshold on the required minimum value for the singular values $\sigma_i$, and to discard the singular values for which $\sigma_i$ is smaller than the threshold. Another, more common, approach is to normalise all singular values with the largest singular value $\sigma_1$ and to apply a relative threshold on the minimum value of the quantity $\sigma_i/\sigma_1$, and to discard the singular values for which the quantity $\sigma_i/\sigma_1$ is smaller than the threshold, Suppose that for the singular value decomposition of $\psi^{kj}_r$, such a threshold yields a selection of, e.g. the largest, $N_M$ singular values $\sigma_i$ (i=1 ... $N_M$). An orthogonal basis of $N_M$ eigenvectors that accurately represent the space $N^k_j \times N_r$ of the junction DOFs $x^k_j$ in terms of the assembly's generalised eigenvectors is then obtained by selecting the first $N_M$ columns of the matrix U in equation [10]. One can apply such an orthogonalisation also for various thresholds, yielding various selections of $N_M$. This allows comparing different sets of basis functions in order to reduce further the number of functions while still preserving an accurate representation of the boundary deformation space. Selection of the set of basis functions, where orthogonalisation also may involve orthonormalisation, is performed in step 314.

In other words, in step 312, for each sub-structure (k=a, b, c, ... ) in the assembled structure, preferably an orthogonal basis is obtained of the assembly modal displacement vectors $\psi^{kj}_r$. Alternatively, one can adapt a process in which one single orthogonal basis is obtained on the global assembly level. In both cases, for this purpose an orthogonalisation procedure can be used, based on e.g. SVD, QR-decomposition, ... For each sub-structure, the matrix of $N_M$ eigenvectors that is thus selected in step 314 is denoted as $\psi^{kj}_M$ from here onwards. These eigenvectors further are referred to as interface basis functions.

In a further step 316, constraining of the sub-structure interfaces is performed. The system equation expressed for the interior and junction—or interface—degrees of freedom is given by equation [2], as described above. In the present step 316, restricting the junction DOFs $x^k_j$ by expressing them in terms of the $N_m$ orthogonal interface basis functions present as vectors in the matrix $\psi^{kj}_M$ is performed by expressing the junction DOFs $x^k_j$ as a linear combination of the orthogonal set of $N_m$ interface basis functions $\psi^{kj}_M$, that are simply denoted $V^k$ from here onwards, weighted with participation factors $p^k$, $$x^k_j = V^k \cdot p^k \quad \text{Eq [11]}$$

Equation [11] thus expresses how the sub-structure interfaces are constrained. By substituting equation [11] in equation [2], equation [12] is obtained $$\begin{bmatrix} M^k_{ii} & M^k_{ij}(V^k) \\ (V^k)^T M^k_{ji} & (V^k)^T M^k_{jj}(V^k) \end{bmatrix} \begin{bmatrix} \ddot{x}^k_i \\ \ddot{p}^k \end{bmatrix} + \begin{bmatrix} K^k_{ii} & K^k_{ij}(V^k) \\ (V^k)^T K^k_{ji} & (V^k)^T K^k_{jj}(V^k) \end{bmatrix} \begin{bmatrix} x^k_i \\ p^k \end{bmatrix} = \begin{bmatrix} f^k_i \\ (V^k)^T f^k_j \end{bmatrix} \quad \text{Eq. [12]}$$

The effect of constraining the sub-structure's junction DOFs $x^k_j$ using equation [11] is that linear combinations of the interface basis functions $V^k$, also referred to as waves, are the only admissible boundary deformations, In a Finite Element analysis procedure, the constraint equation in equation [11] takes the form of a constraint relation to express the DOFs $x^k_j$ in terms of the interface basis functions $V^k$ weighted with participation factors $p^k$.

It can be seen in the sub-structure's system matrix equation in equation [12] that the number of junction DOFs $x^k_j$ is replaced by the number of participation factors $p^k$. Provided that the number of basis functions in the set $V^k$ is smaller than the number of junction DOFs $x^k_j$, this substitution reduces the size of the sub-structure's system matrix equation in equation [12].

Before assembling of the sub-structures, reduction of the sub-structure optionally first may be applied, shown as step 318 of the method. It will be clear that reduction does not need to be done for every sub-structure. In principle none of the sub-structures should be reduced. Often at least the largest sub-structure model is reduced. Typically, in a designing process, only the sub-structure that will be modified in a later design stage remains unreduced, while all other sub-structures are reduced. For component model reduction of a sub-structure k, a modal analysis is performed for the sub-structure k separately. The degrees of freedom $x^k$ of the sub-structure k can then be expressed in terms of a limited number of component modes. Mathematically, a modal analysis separately for sub-structure k is performed by obtaining a set of normal modes as the solution of the eigenvalue problem associated with equation [12], expressing the system matrix for sub-structure k with the junction DOFs $x^k_j$ expressed as a linear combination of the interface basis functions $V^k$. The latter is indicated as step 320.

For each sub-structure k separately, a set of normal modes is obtained as the solution of the eigenvalue problem associated to equation [12]. That is, in a frequency range of interest $[f^k_{min}, f^k_{max}]$ for that sub-structure, the $N^k_r$ real eigenvalues $\lambda^{kcn}_r$ (r=1 ... $N^k_r$) are obtained as a solution of equation of type [6], with corresponding eigenvectors $\psi^{kcn}_r$. An expression analogous with equation [9] can then be defined that expresses the interior DOFs $x^k_i$ (or a subset thereof) together with the participation factors $p^k$ in terms of the eigenvectors $\psi^{kcn}_r$ weighted with participation factors $s^k$, respectively. The latter, indicated by step 322, is expressed in equation [13], i.e.

$$\begin{bmatrix} x^k_i \\ p^k \end{bmatrix} = [\psi^{kcn}_r] \cdot s^k = \begin{bmatrix} \psi^{kcn}_{i,r} \\ \psi^{kcn}_{p,r} \end{bmatrix} \cdot s^k \quad \text{Eq. [13]}$$

In order to improve the capacity of the natural component modes $\psi^{kcn}_r$ as a sufficiently accurate basis for the component dynamics, $f^k_{max}$ may preferably be chosen substantially higher than the maximum frequency of interest $f_{max}$, typically specified by the end-user. After all, as, on a sub-structure level, the modes are truncated above the highest frequency $f^k_{max}$, while these higher order modes still may have an effect on the frequency range of interest $[f^k_{min}, f^k_{max}]$ for the considered sub-structure, this truncation also affects the modes in the frequency range of interest for the assembly $[f_{min}, f_{max}]$. Selecting a substantially higher $f^k_{max}$ then allows to at least partly solve this problem. It is to be noted that there are various 'component mode synthesis' techniques available in the state-of-the-art.

In a final step 324, the sub-structures are assembled again by enforcing the equilibrium and continuity conditions being expressed in terms of the interface degrees of freedom. An arbitrary number of k sub-structures can be assembled into an assembly structure by enforcing equilibrium and continuity conditions between the junction degrees of freedom of the sub-structures. The latter has already been explained above in relation to equation [3] and equation [4], where an example has been presented to connect two sub-structures a and b which have $N^a_j$ and $N^b_j$ junction DOFs $x^a_j$ and $x^b_j$ respectively. Using equation [11] to express the junction DOFs $x^a_j$ and $x^b_j$ as linear combinations of orthogonal sets of interface basis functions $V^a$ and $V^b$, weighted with the participation factors $p^a$ and $p^b$, respectively allows the general flexibility relation along that junction, expressed in equation [3], to be written as $$\begin{bmatrix} V_a^T & f_j^a \\ V_b^T & f_j^b \end{bmatrix} = \begin{bmatrix} V_a^T \hat{K}_{aa} V_a & V_a^T \hat{K}_{ab} V_b \\ V_b^T \hat{K}_{ba} V_a & V_b^T \hat{K}_{bb} V_b \end{bmatrix} \begin{bmatrix} p^a \\ p^b \end{bmatrix} = \hat{K}_{pro} \begin{bmatrix} p^a \\ p^b \end{bmatrix} \quad \text{Eq. [14]}$$

In order to assemble two sub-structures a and b thus requires enforcing the general interface flexibility matrix $\hat{K}_{pro}$ on the participation factors $p^a$ and $p^b$ that define the junction between sub-structure a and sub-structure b, that in general has a different number of junction DOFs $N^a_j$ and $N^b_j$. It should be noted that a sub-structure k hereby can be a full finite element model. In that case, the participation factors $p^k$ are embedded in a constraint relation equation [11]. In case the sub-structure is reduced, the participation factors $p^k$ are embedded in the sub-structure's modal displacement vectors in equation [13] that consist of the natural modes $\psi^{kcn}_r$ and optionally also additional enrichment vectors, e.g. residual vector modes $\psi^{kcres}_r$, the latter being described in more detail in the second embodiment. This makes no difference for the procedure. The equilibrium and continuity equations are always defined between the participation factors $p^a$ and $p^b$ that define the junction between a and b.

By way of illustration, assembly for a rigid connection is described. If a rigid connection is used between two sub-structures a and b that have coincident junction nodes (with junction DOFs $x^a_j$ and $x^b_j$), the number of junction DOFs $N^a_j$ of sub-structure a equals the number of junction DOFs $N^b_j$ of substructure b. For a rigid connection, some coefficients of the interface flexibility matrix $\hat{K}_{pro}$ in equation [14] become infinite. A very simple set of equilibrium and continuity conditions can then be applied on participation factors $p^a$ and $p^b$, expressed in equation [15]

$$p^a + p^b$$

$$f_j^a + f_j^b = 0 \quad \text{Eq. [15]}$$

Provided that the implementation of the rigid connection conditions in equation [15] would cause an execution error for the FE solver that is being used, it should be noted that said rigid connection conditions may be relaxed without major loss of accuracy For instance, one can approximate rigid connection conditions between two reduced sub-structures a and b by considering very high stiffness values in the matrices $\hat{K}$ (that is, $\hat{K}_{aa}$, ...) in equation [14].

In case reduced modal models are obtained for a number, possibly for all, sub-structures, the so-called reduced modal models are then assembled to obtain a much smaller description of the assembly as a whole, compared to the entire FE model.

In a second embodiment, the present invention relates to a method for efficiently sub-structuring a dynamical system, e.g. complex dynamical system, as described in the first embodiment, whereby the reduction of the sub-structure is performed prior to the final assembling based on a method using component modes with e.g. a free interface, enriched with enrichment vectors, e.g. residual flexibility vectors, to expand the sub-structure degrees of freedom. Enrichment vectors are vectors determined by a static or dynamic deformation of a system, or a model or reduced model thereof, as a consequence of a force excitation and/or an enforced deformation of part of the system. Although in the present embodiment, the use of enrichment vectors is mainly described using residual flexibility vectors, the invention is not limited thereto. Other possible modes for enrichment of the modal base, as known from component mode synthesis methods, also may be used. Such enrichment vectors may e.g. be inertia-relief modes, operational deflection shapes, rigid body modes, inertia-relief attachment modes, residual inertia-relief attachment modes, etc. The present description, by way of illustration, is mainly oriented to residual flexibility vectors which illustrate a possible implementation of a combination of wave based sub-structuring and component mode synthesis. Due to the use of interface basis functions, the enrichment vectors, e.g. residual flexibility vectors, get a more distributed rather than a local character which results in an enhanced efficiency of the model reduction process. By way of illustration, an example of such a reduction method for a sub-structure is described mathematically in more detail.

Without loss of generality, it is assumed for the following mathematical description that the lower frequency limit $f^k_{min}$ for the sub-structure's frequency range of interest is given by 0 Hz.

First, the free-free normal modes $\psi^{kcn}_r$ are computed as described in the example of the first embodiment. It thereby is to be noted that the participation factors $p^k$ are free, in contrast to conventional modal analysis where the junction DOFs $x^k_j$ are free. Then, the enrichment vectors, e.g. residual vectors $\psi^{kcres}_r$, also referred to as residual attachment modes, are computed for the participation factors $p^k$ in equation [12], instead of for all junction DOFs $x^k_j$ as in equation [2]. It is an advantage of the present invention that the enrichment vectors, e.g. residual vectors, are associated with the participation factors $p^k$ used in the reduction step of the sub-structuring method according to the present invention. The residual vectors, for equation [12] are statically defined by the deformation due to a unit force exerted on a single participation factor contained in $p^k$. To explain this into more detail, first the substitution $f_p^k = (V^k)^T f_j^k$ can be made in equation [12], where $f_p^k$ will be called the wave load vector from here on, resulting in equation [16], i.e.

$$\begin{bmatrix} M^k_{ii} & M^k_{ij}(V^k) \\ (V^k)^T M^k_{ji} & (V^k)^T M^k_{jj}(V^k) \end{bmatrix} \begin{bmatrix} \ddot{x}^k_i \\ \ddot{p}^k \end{bmatrix} + \\ \begin{bmatrix} K^k_{ii} & K^k_{ij}(V^k) \\ (V^k)^T K^k_{ji} & (V^k)^T K^k_{jj}(V^k) \end{bmatrix} \begin{bmatrix} x^k_i \\ p^k \end{bmatrix} = \begin{bmatrix} f^k_i \\ f^k_p \end{bmatrix} \quad \text{Eq. [16]}$$

The enrichment vectors, e.g. residual vectors $\psi^{kcres}_r$, for the sub-structure's component modal description are obtained by successively applying a junction force vector $f_p^k$ with a value of 1 at the location corresponding to each participation factor $p^k$ of interest and zeros elsewhere. This means that an enrichment vector, e.g. a residual vector, is not linked to one single junction DOF but to the entire junction: the unit force applied to one of the terms in the wave load vector $f_p^k$, is distributed over the entire interface (it is to be realised that $f_p^k = (V^k)^T f_j^k$, and that $(V^k)^T$ is defined for all junction DOFs $x^k_j$, so that the unit force is distributed over all these junction DOFs). As there are typically much more junction DOFs than participation factors $p^k$, one obtains an accurate description of the local flexibility at the interface with a lower number of enrichment vector, e.g. residual vector, modes, With the inclusion of the enrichment vectors, e.g. residual vectors $\psi^{kcres}_r$, an enriched modal basis is obtained, so that the sub-structure's interior DOFs $x^k_i$ (or a subset thereof) together with the participation factors $p^k$ are expressed in terms of the eigenvectors $\omega^{kcn}_r$ and the enrichment vectors, e.g. residual vectors $\psi^{kcres}_r$, weighted with sets of participation factors $s^k_i$ and $s^k_p$, respectively:

$$\begin{bmatrix} x^k_i \\ p^k \end{bmatrix} = [\psi^{kcn}_r \quad \psi^{kcres}_r] \begin{bmatrix} S^k_i \\ S^k_p \end{bmatrix} \qquad \text{Eq. [17]}$$

This is an important difference. It means that with the wave-based sub-structuring approach, typically a much lower number of enrichment vectors, e.g. residual vectors, must be computed, which enhances the efficiency of the model reduction procedure for the sub-structure in the finite element solver (for instance, numerical problems may arise from computing an enrichment vector, e.g. residual vector, for each junction DOF). When these enrichment vectors, e.g. residual vectors, are added to the basis of generalised eigenvectors, an improved description of local flexibility at the interface is obtained. In this way, the accuracy of the sub-structure modal basis is improved, by including the static contribution vectors of the truncated high order modes above $f^k_{max}$. Furthermore, with a smaller number of enrichment vectors, e.g. residual vectors $\psi^{kcres}_r$, a smaller reduced modal model for the considered sub-structure is obtained.

In a third embodiment, the present invention relates to a method for tuning the functional performance characteristics of a physical system, such as e.g. a consumer product like a car, a ground vehicle like e.g. a truck, bus, rail vehicle or tractor, an aeroplane, a spacecraft, industrial machinery, etc. The method is related to physical systems that can be modelled as an assembly of component subsystems that interconnect to each other, wherein a method according to any of the previous embodiments is applied. The different steps of the method 400 for tuning the functional performance characteristics of a physical system are shown in FIG. 5, In step 402 a specific design of a physical system that is to be studied is defined. The physical system is then, in step 404, translated in a mathematical model, which typically may be a finite element model, although the invention is not limited thereto. The mathematical model may e.g. be another element-based model. In the following step, any of the methods for studying the dynamic analysis of the system, using sub-structuring, as described in the first and the second embodiment may be applied. A detailed description of these methods is described above. In step 408, the relevant physical quantity information is extracted. In step 410 it is decided whether another design, typically a modified design of the design defined in step 402, needs to be studied, A design optimisation may consist of numerous iterations involving hundreds of FE analysis runs. If another design is to be studied, in step 412 the changed design of the physical system is obtained. In case of study of the vibration and/or acoustical behaviour, such changes in for instance vehicle design may be e.g. the selection of a suitable material for a component, changing the weight and the mass centre of a component, performing vehicle trim body modelling, adding a local stiffener patch to a vehicle floor or strengthening a joint connection, determining the optimal connection stiffness of a windscreen in a vehicle body in white comprising the whole car body, etc. It is to be noted that step 412 may be performed automatically by immediately changing a property in the mathematical model, as performed in step 414, In step 414, the change in design of the physical system is translated in a change in mathematical model, E.g. selection of a suitable material for a component is translated in changing the Young's modulus, density and Poisson coefficient of a finite element component, changing the weight and the mass centre of a component corresponds with drilling a hole in a component and changing the shell thickness, modelling vehicle trim bodies corresponds with adding a large concentrated mass, adding a local stiffener patch to a vehicle floor, determining the optimal connection stiffness of a windscreen is translated in modifying the translational stiffness of the flexibility relations between components, etc. From this changed mathematical model physical quantity information is extracted. Typically the changed mathematical model is based on a description of the sub-structures and interfaces using a basis of the interface basis functions as defined in step 406, i.e. without recalculating this basis. The extracted physical quantity information allows comparison with other solutions. The latter is expressed by closing the loop from step 414 to step 408. A large number of modified designs can in this way be studied. When no further modified designs need to be studied, the method 400 ends in step 416.

Figure 6A:
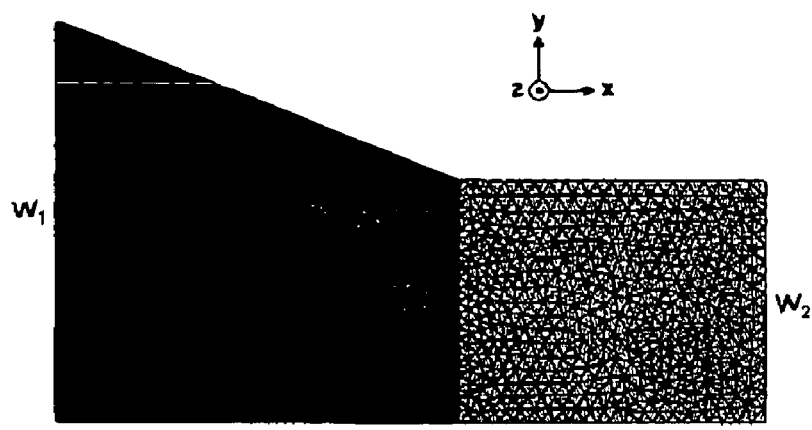
FIG. 6a and FIG. 6b show a front view respectively top view of an exemplary system used for illustrating the method for tuning the functional performance characteristics according to a third embodiment of the present invention.
Figure 6B:
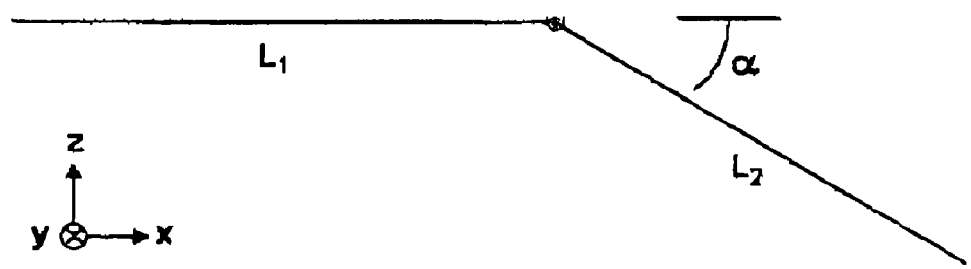

By way of example, a physical system based on two sub-structures, e.g. two steel plates, is described and the method of tuning the functional performance characteristics is applied. It is to be noted that the example is only provided by way of illustration, without the invention being limited thereto. The assembly is shown in FIG. 6a showing a front view, and FIG. 6b showing a top view, The component dimensions and properties are listed in table 1. Plate 430 and plate 432 have 21 coincident nodes, along which the connection is defined by 126, i.e. 6×21, junction DOFs. Plate 432 makes an angle α with the X-Y plane. It can be seen that plate 430 is larger and slightly thicker than plate 432 and almost twice as heavy. However, the component modal analysis results in table 1 show that they exhibit similar modal densities: Plate 1 has 70 modes in the range [0-1000]Hz, while Plate 2 has 56 modes.

TABLE 1

| | Plate 430 | Plate 432 |
|---|---|---|
| Length L | $L_1 = 0.5$ m | $L_2 = 0.434$ m, |
| Width W | $W_1 = 0.5$ m, $W_2 = 0.3$ m | $W_2 = 0.3$ m |
| Thickness T | $T_1 = 1.0 \cdot 10^{-3}$ m | $T_2 = 8.5 \cdot 10^{-4}$ m |
| Connection angle α | | α = 31.05° |
| Mass density ρ | $\rho_1 = 7850$ kg/m³ | $\rho_2 = 7850$ kg/m³ |
| Poisson's ratio ν | $\nu_1 = 0.3$ | $\nu_2 = 0.3$, |
| Young's modulus E | $E_1 = 210$ GPa | $E_2 = 210$ GPa |
| Finite Element mesh | 441 nodes, 400 (QUAD4) elements | 434 nodes, 789 (TRIA3) elements |
| Total Mass M | $M_1 = 1.570$ kg | $M_2 = 0.8685$ kg |
| Free—free component modes (modal analysis in range [0-1000 Hz]) | 6 rigid body modes 70 modes | 6 rigid body modes 56 modes |

Different types of joints can be provided between the different sub-structures of the structure. As a reference both a nominal rigid case, whereby a rigid connection of all DOFs of the 21 pairs of interface nodes along the line interface are provided, and a nominal elastic case, whereby an elastic connection of all DOFs of the 21 pairs of interface nodes are provided, are discussed. In case of elastic connection, the translational DOFs are connected with a translational stiffness $K_t = 1.0 \cdot 10^4$ N/m and the rotational DOFs are connected with a rotational stiffness $K_r = 1.0$ N·m/rad, Applying the sub-structuring method as described in any of embodiments 1 and 2 reveals that for the nominal rigid case in the range [0,250] Hz yields 44 basis functions whereas in the nominal elastic case in the same frequency range yields 48 interface basis functions. As the number of basis functions in both cases is less than the number of junction DOFS, i.e. 126 in number, the problem size is reduced. The latter illustrates one of the advantages of the present invention.

For 5 different modification analysis scenarios, the reductions and modifications of plate 340, plate 342 and its connections are summarised in Table 2. The sub-structuring method as described in the present embodiment is validated against full finite element assembly results, where the same modifications are applied to the full assembly model, whereby conventional coupling and no component reduction occurs for examples in the frequency range [0-250]Hz. The relative eigenfrequency differences are compared and the Modal Assurance Criterion (MAC) is used to compare the mode shapes. The modal assurance criterion expresses a correlation between two vectors, defined/evaluated at the same degrees of freedom. A MAC having a unity value refers to a perfect correlation between both vectors. A MAC having a zero value refers to no correlation at all. Typically, modal assurance criterion values are in between these two limit cases. The average relative eigenfrequency differences will be indicated with a full line, whereas the maximum values for the relative eigenfrequency difference will be indicated with a dashed line. Similarly, the average MAC will be indicated with a full line, whereas the maximum-minimum values for the MAC will be indicated with a dashed line. For all examples, it will be seen that the relative eigenfrequency difference is always positive. The interface flexibility in the assembly is slightly reduced (by expressing the junction DOFs in terms of the basis functions), so that a small amount of stiffness is added to the system. The eigenfrequencies predicted with the approach according to the present invention are therefore slightly larger than in the reference case.

TABLE 2

|  | Plate 430 | Plate 432 | Connection |
|---|---|---|---|
| Scenario 1 | Create reduced modal model | Drill a hole, and modify the Young's modulus $E_2$ |  |
| Scenario 2 | Create reduced modal model | Drill a hole, and modify the thickness $T_2$ |  |
| Scenario 3 | Add a concentrated mass at various locations | Create reduced modal model |  |
| Scenario 4 | Add a stiffener patch at various locations | Create reduced modal model |  |
| Scenario 5 | Create reduced modal model | Create reduced modal model | Translational stiffness $K_t$ modified (Elastic Case) |

Figure 7A:
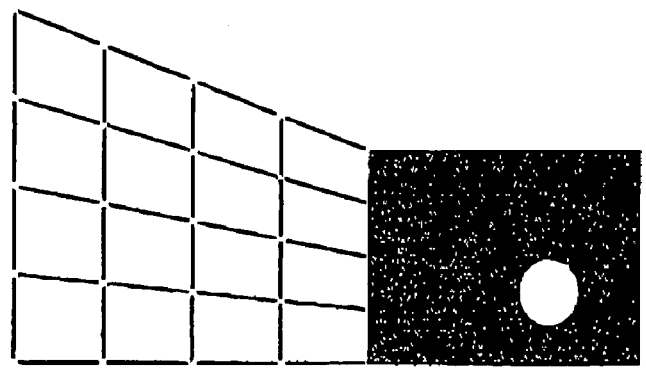
FIG. 7 to FIG. 9 illustrate different modified designs of the exemplary system as shown in FIG. 6a and FIG. 6b and the corresponding relative eigenfrequency difference and Modal Assurance Criterion (MAC) results for the rigid and/or elastic coupling of substructures of the system.
Figure 7B:
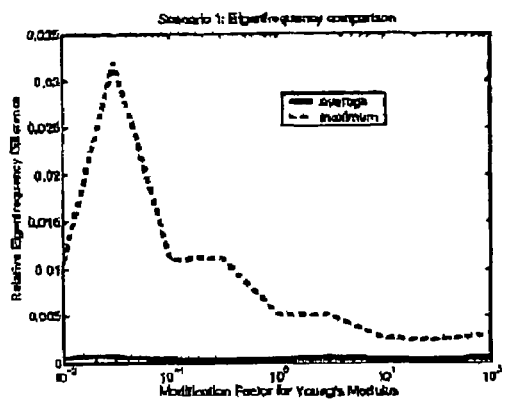
Figure 7C:
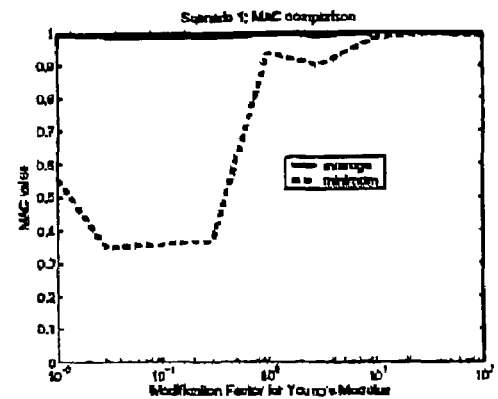
Figure 7D:
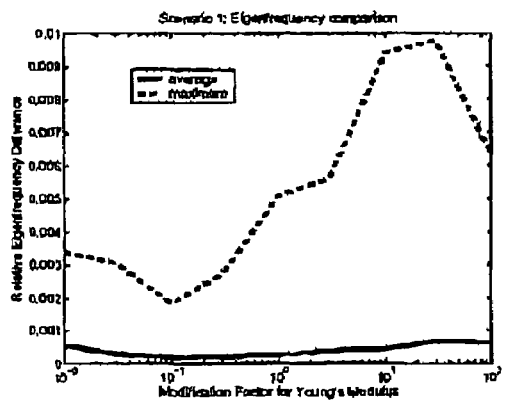
Figure 7E:
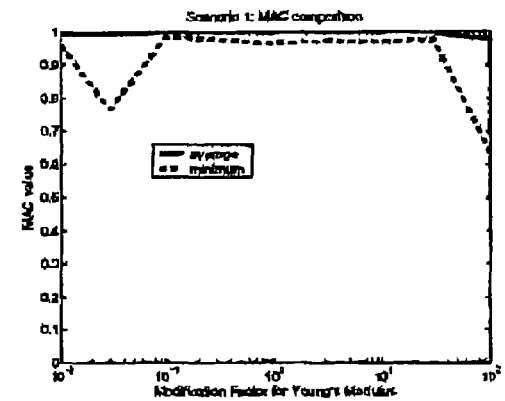

For scenario 1, whereby a hole is drilled and the Young's modulus is changed, the reduced modal model, created from a normal mode solution, by replacing the FE coordinates with modal coordinates on a reduced DOF subset, of plate 430 is assembled with a direct FE model of plate 432. A hole is dilled in plate 432, with a diameter of 0.1 m. FIG. 6a shows that plate 432 contains a circular set of triangular elements; these are excluded here, as can be seen in FIG. 7a, In addition, the Young's modulus of plate 432 is modified, with a factor ranging from $10^{-2}$ to $10^2$. For both the rigid case and the elastic case, the resulting physical quantity characteristics have been worked out. FIG. 7b shows the relative eigenfrequency difference and FIG. 7c shows the MAC for the rigid case. The average relative eigenfrequency difference is very low and positive and shows a maximum value less than 3.5%. The average MAC (FIG. 7c) is almost unity as with decreasing Young's modulus, only a few mode shapes are missed Changing the Young's Modulus nevertheless has a large effect on the dynamics and modal density: with a factor $10^{-2}$ there are 135 natural modes. This number decreases to 29 with a factor of $10^2$. The lowest modes are most accurately predicted. When the Young's modulus increases, only these lowest modes are dominating the response, so that the averaged accuracy increases. FIG. 7d and FIG. 7e show the relative eigenfrequency difference and the MAC results for the elastic case. The results are even more accurate than for the rigid case: the maximum value on the relative frequency difference is less than 1%. With decreasing Young's modulus, the minimum MAC first decreases, because of an ongoing mode shift, and then increases again as the two shifting modes have separated again. Mode shifts can be evaluated by studying the MAC values between two sets of eigenvectors, e.g. from a MAC matrix built up from sorted and plotted MAC values, as known by the person skilled in the art.

Figure 7F:
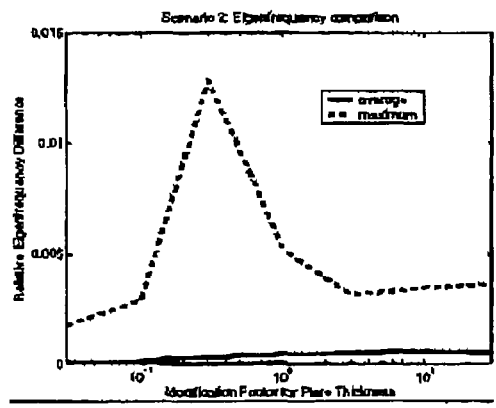
Figure 7G:
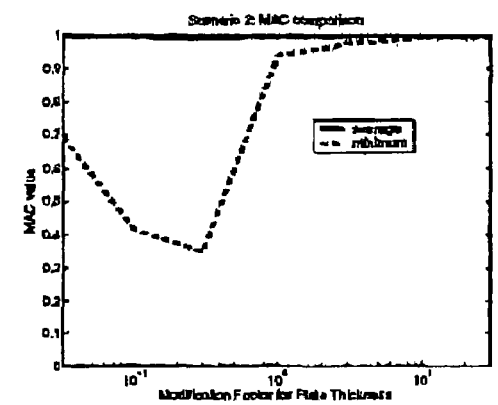

In scenario 2, the reduced modal model of plate 430 is assembled with the direct finite element model of plate 432. A hole is drilled in plate 432, and the thickness $t_2$ of plate 432 is modified with a factor ranging from 0.03 to 30. Again, the rigid and the elastic case have been worked out. The results for the rigid case are displayed in FIG. 7f, showing the relative eigenfrequency difference, and in FIG. 7g, showing the MAC results. The results for the rigid case as well as the results of the elastic case (not shown) are qualitatively comparable with those for scenario 1. Nevertheless, quantitatively, modification of the plate thickness has a stronger effect on the modal density than changing the Young's Modulus: for the rigid case, modification of the plate thickness with a factor 0.03 results in 324 natural modes. This number decreases to 21 with a factor 30. All modifications are very accurately predicted: the average relative eigenfrequency difference is a very low, positive value, with a maximum value below 1.5%. The average MAC is almost unity. Again, the results become more accurate with increasing plate thickness, as the accurately predicted lowest modes then become more dominant.

Figure 8C:
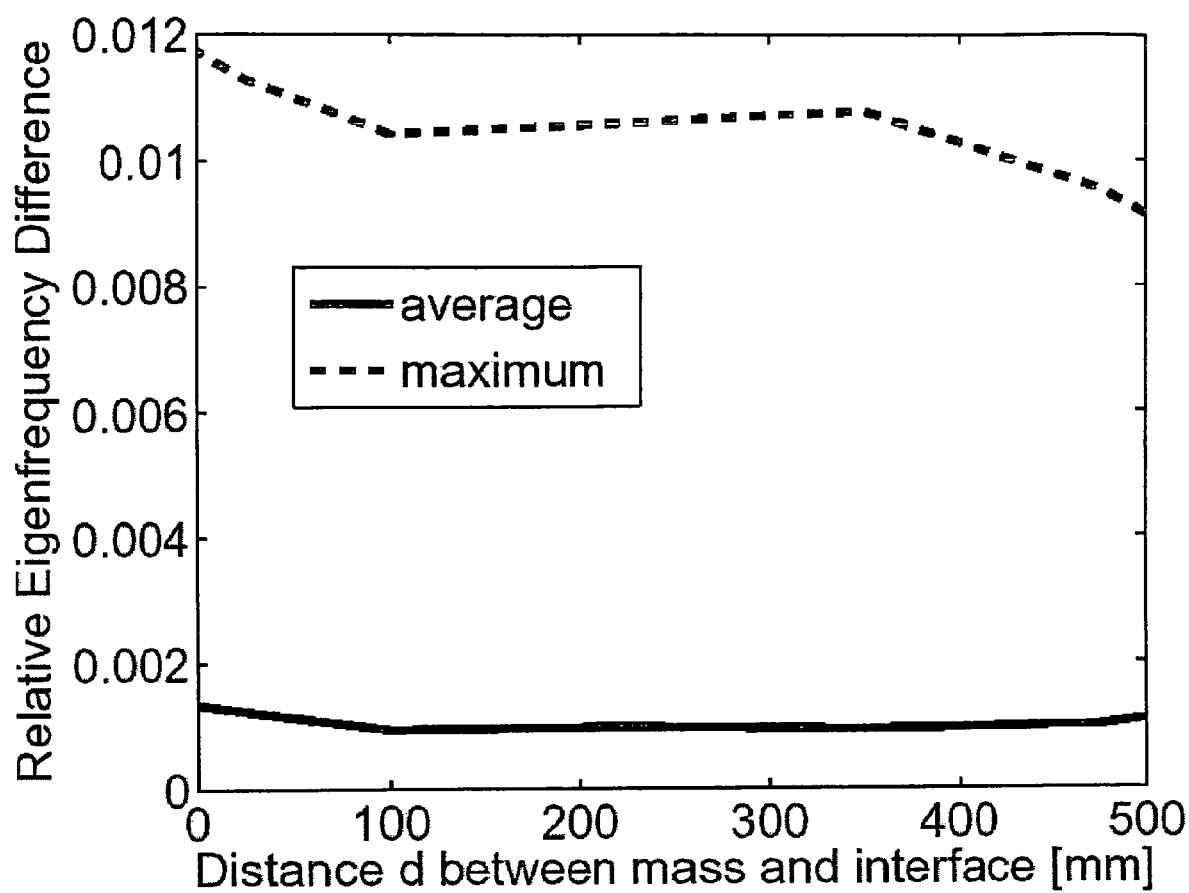
Figure 8D:
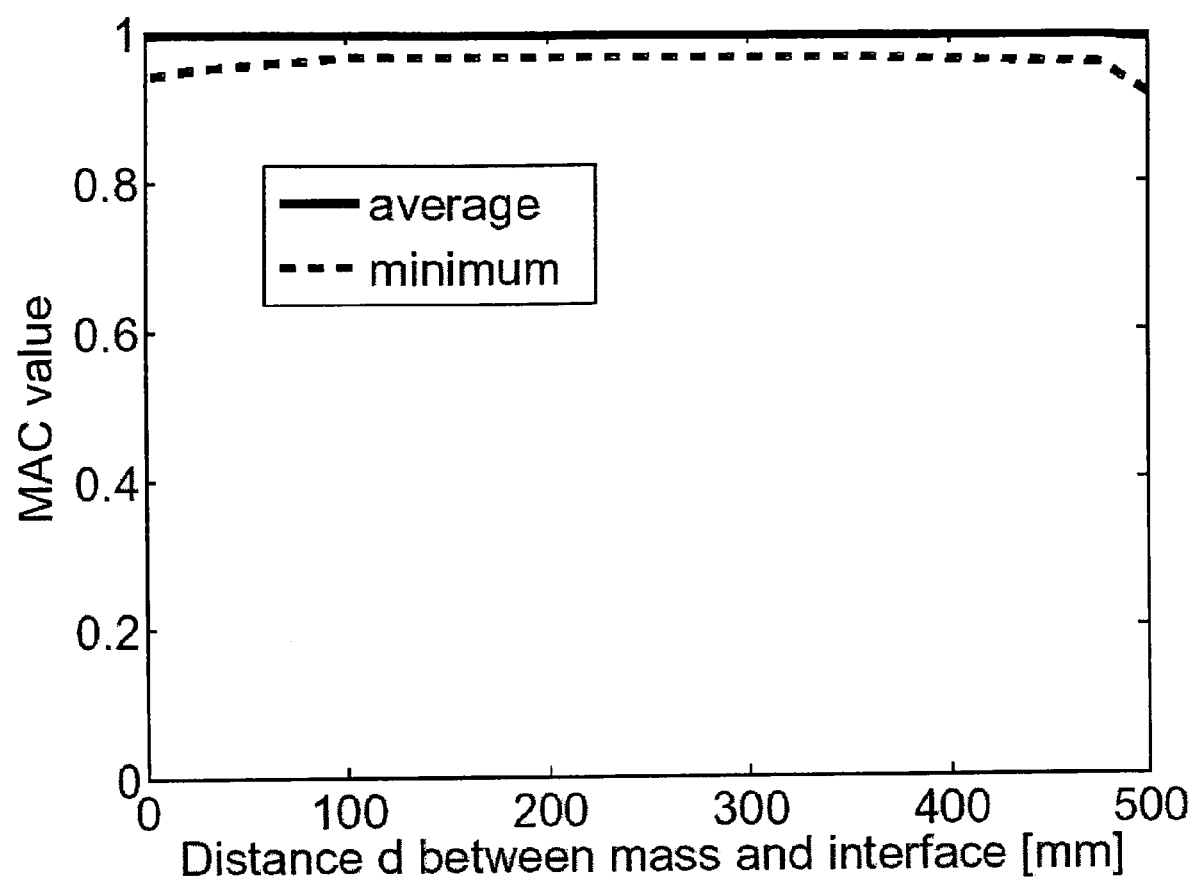

In scenario 3, the reduced modal model of plate 432 is assembled with the direct FE model of plate 430, on which concentrated masses are attached at distances d from the interface The latter is illustrated in FIG. 8a and FIG. 8b, the latter being an enlarged view of the upper left corner of plate 430 of FIG. 8a. Seven locations of concentrated masses are indicated with a black dot (●). The obtained effects are shown for the elastic case, with the added mass equal to the total mass $M_1$ of plate 430. The predictions using a method according to the present invention are very accurate, as can be seen in FIG. 8c showing the relative eigenfrequency differences and FIG. 8d showing the MAC results. The quality slightly decreases closer to the interface, but the relative frequency difference is always below 1.2%, with the MAC close to unity.

Figure 8E:
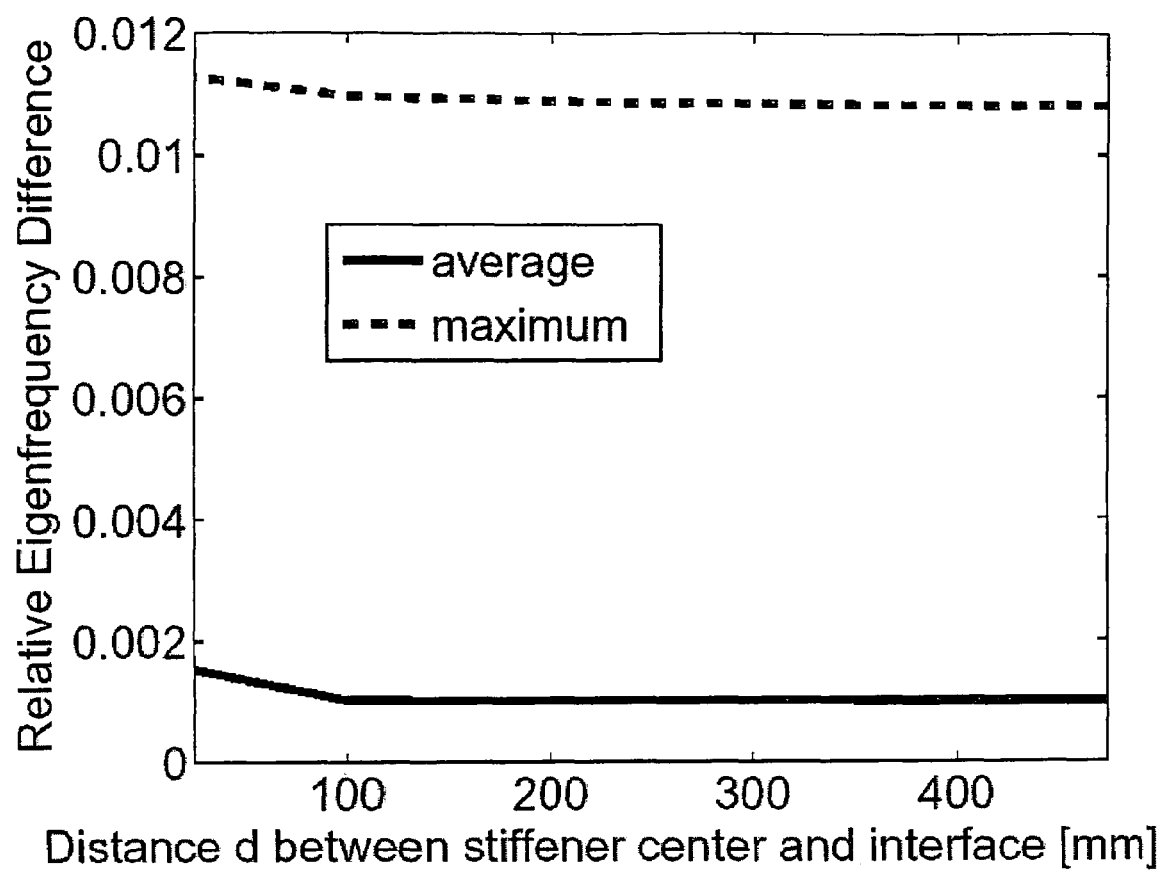
Figure 8F:
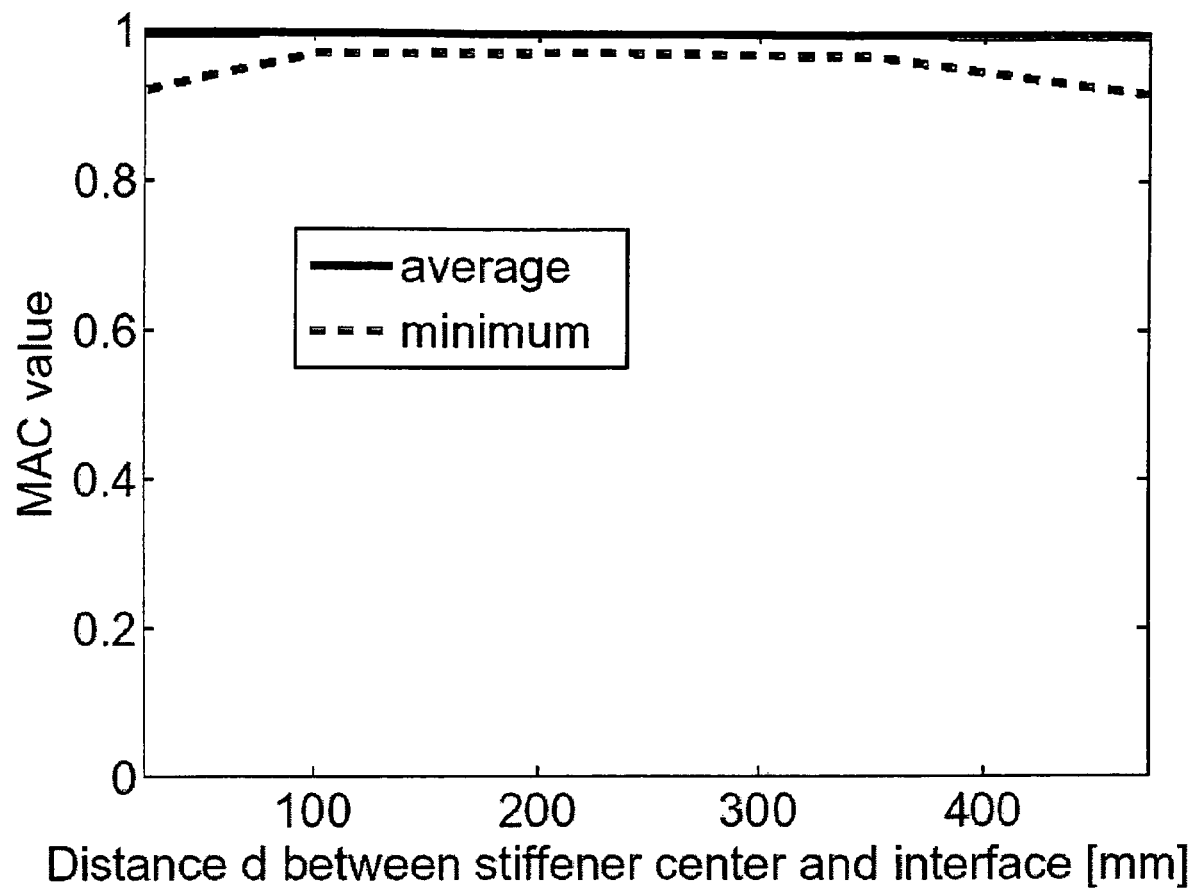

In scenario 4, the reduced modal model of plate 430 is assembled with the full model of plate 432. A stiffener patch is created, by crossing two tube-shaped beams (inner radius 1 mm, outer radius 2 mm). The beams are made of steel, except that the Young's modulus has twice the value for steel. The patches are added at 5 locations on plate 430, as indicated in FIG. 8a and FIG. 8b, whereby the locations of the tube stiffener patches are indicated with crosses instead of dots. The obtained effects are shown in FIG. 8e showing the relative eigenfrequency difference and in FIG. 8f showing the MAC results, for the elastic case, worked out using the tuning method according to the present invention, The relative frequency difference is always below 1.2%, with the MAC close to unity.

Figure 9A:
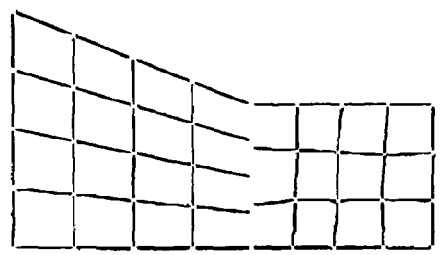
Figure 9B:
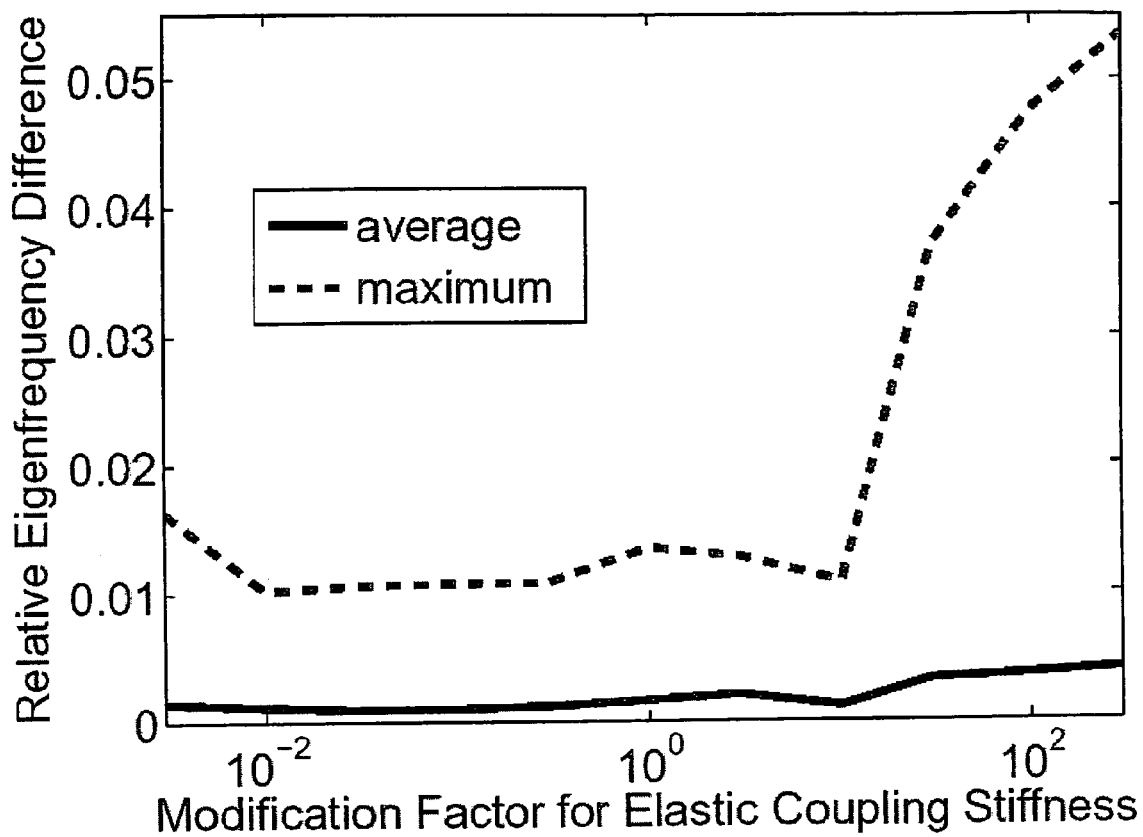
Figure 9C:
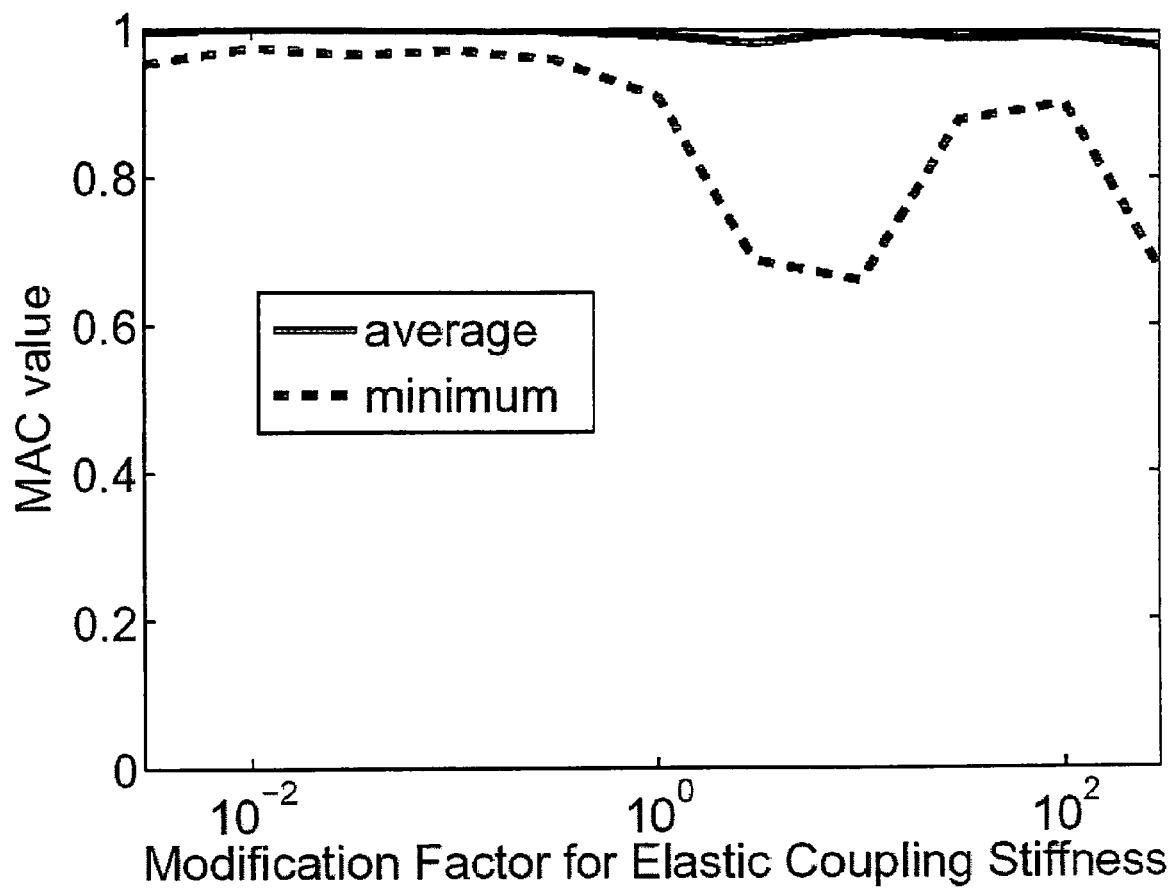
Figure 9A:
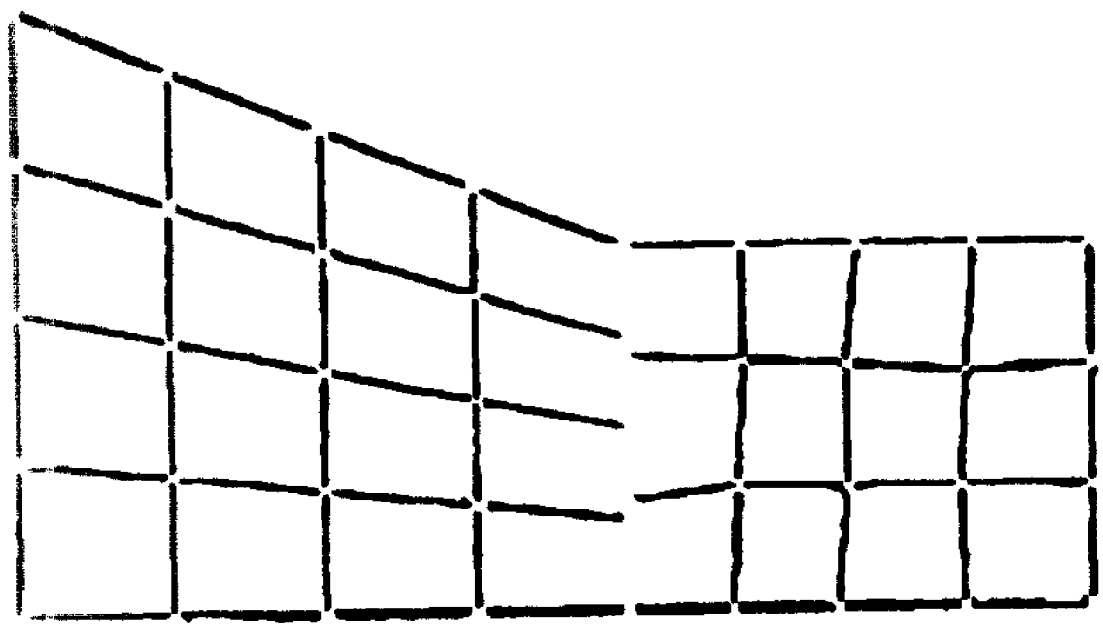
Figure 10:
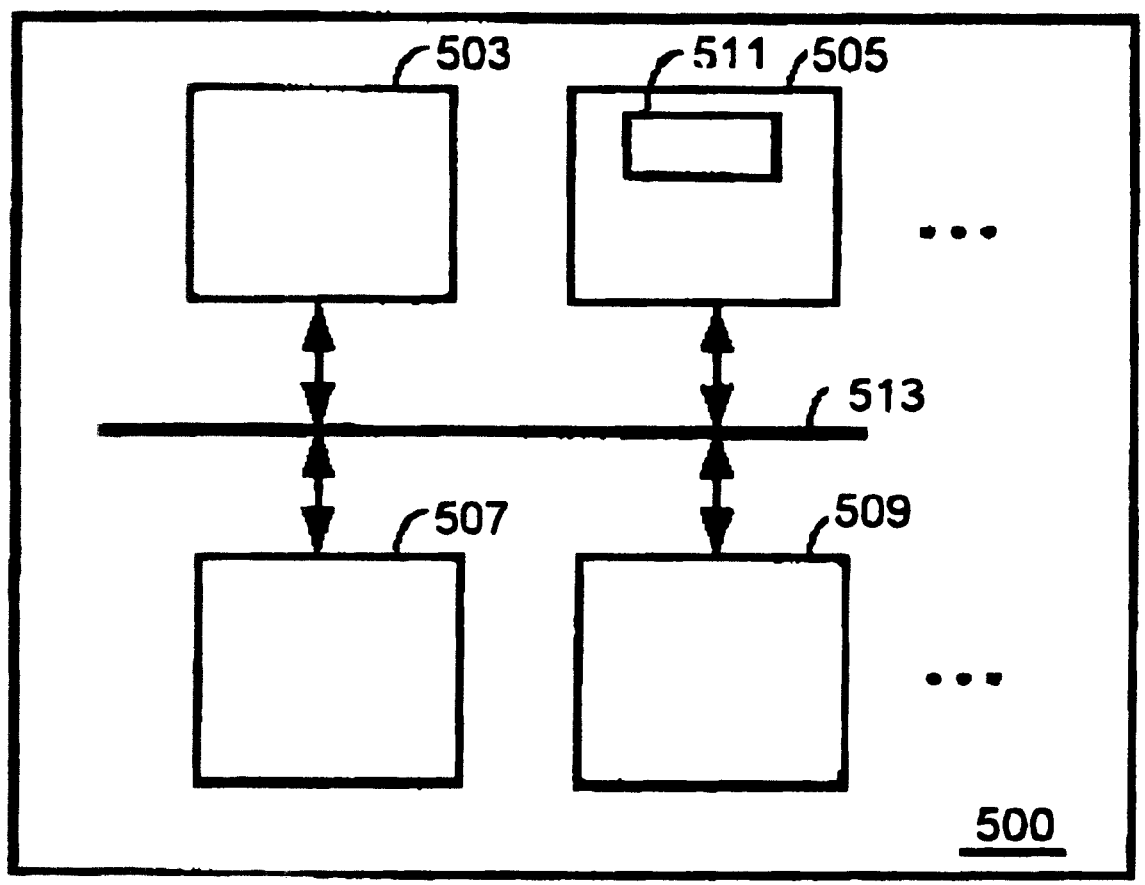

In scenario 5, the reduced modal models of plate 430 and plate 432 are assembled using an elastic connection, as shown in FIG. 9a. The nominal model, described in table 1, had a translational connection stiffness $K_t=1.0 \cdot 10^4$ N/m, and a rotational stiffness $K_r$=1.0 N·m/rad. For Scenario 5, the value of $K_t$ is modified with a factor ranging from $10^{-2}$ to $10^2$, while the rotational connection stiffness is kept constant. The results of tuning according to the method of the present invention are shown in FIG. 9b showing the relative eigenfrequency difference and in FIG. 9b showing the MAC results. It can be seen that for the entire modification range, the average values of relative eigenfrequency difference and MAC remain very accurate. Especially with decreasing $K_t$, the prediction quality is excellent. With increasing $K_t$, the minimal MAC value shows a drop around modification factor $10^1$. This is caused by a switch of two modes. It is to be noted that the eigenfrequency difference is still accurate here, i.e. having a maximum value of about 1%. When the stiffness is further increased, the MAC improves again, as the switched modes are further separated. When the modification factor on $K_t$ increases further beyond $10^1$, a truncation effect occurs: the highest modes are not accurately predicted anymore, so that the prediction error increases. The maximum value for the relative eigenfrequency difference clearly increases and finally also the minimum MAC values drop slightly.

From the above provided examples, it can be seen that the functional performance characteristics, e.g. vibration and/or acoustic behaviour, of an assembly can be tuned by modifying the properties and design of the different components thereof. The examples illustrate that the method for tuning allows to study and to tune the functional performance characteristics, making the method a useful tool for designing physical systems. Although the method is based on performing a single computation of the discretised dynamic model of the complete system, it surprisingly results in an efficient method for tuning a design.

Figure 10:
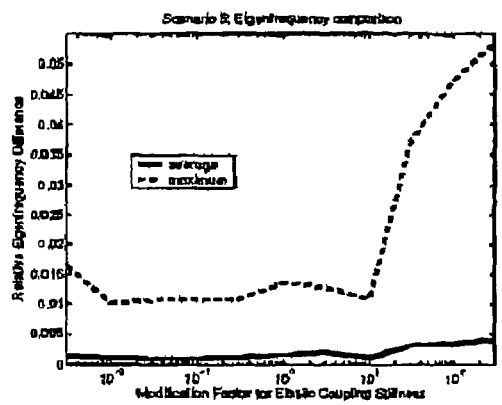
FIG. 10 shows a computing means as can be used for applying the methods according to different embodiments of the present invention.
Figure 10:
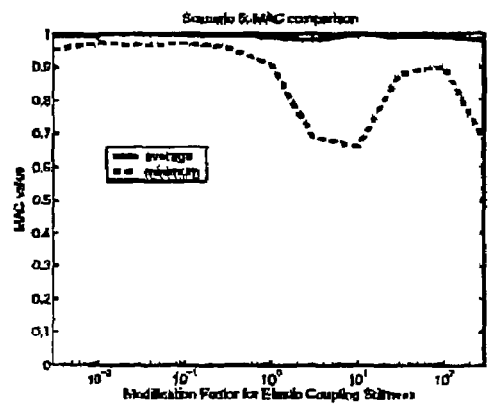
Figure 10:
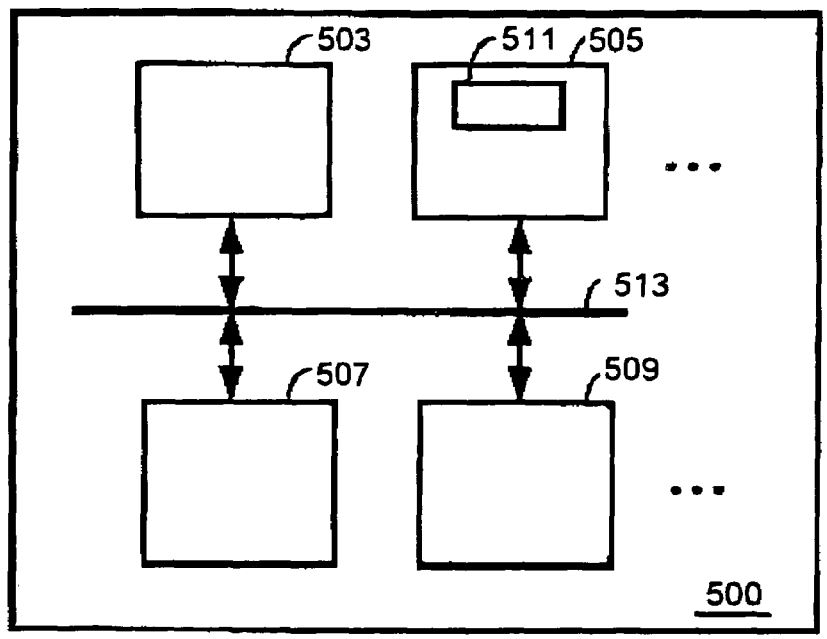
Figure 7B:
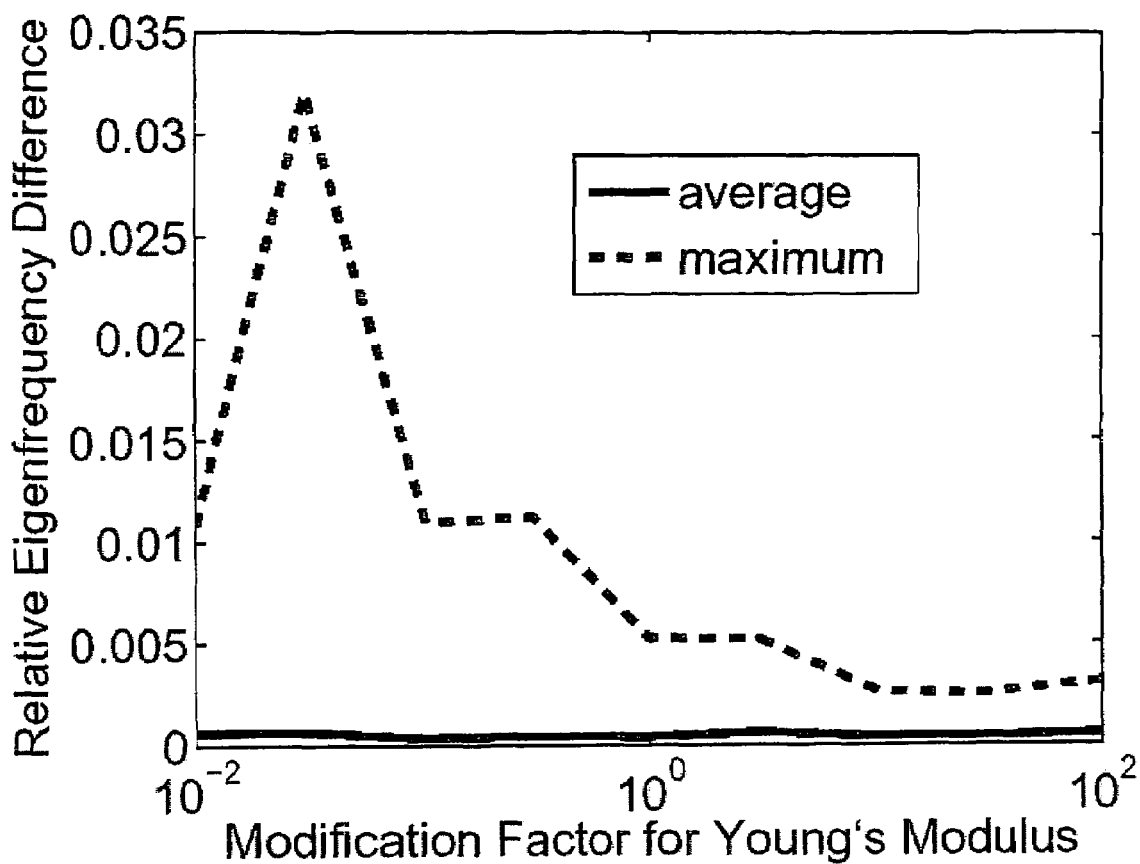
Figure 7C:
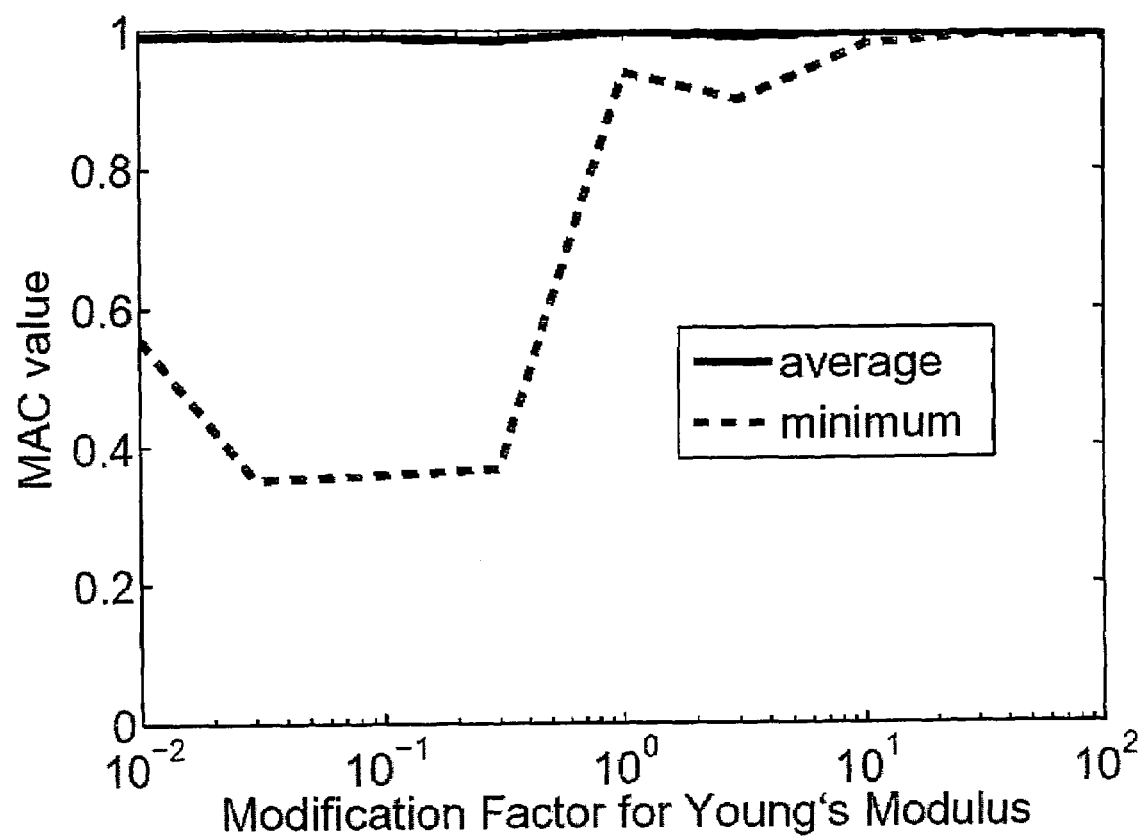
Figure 7D:
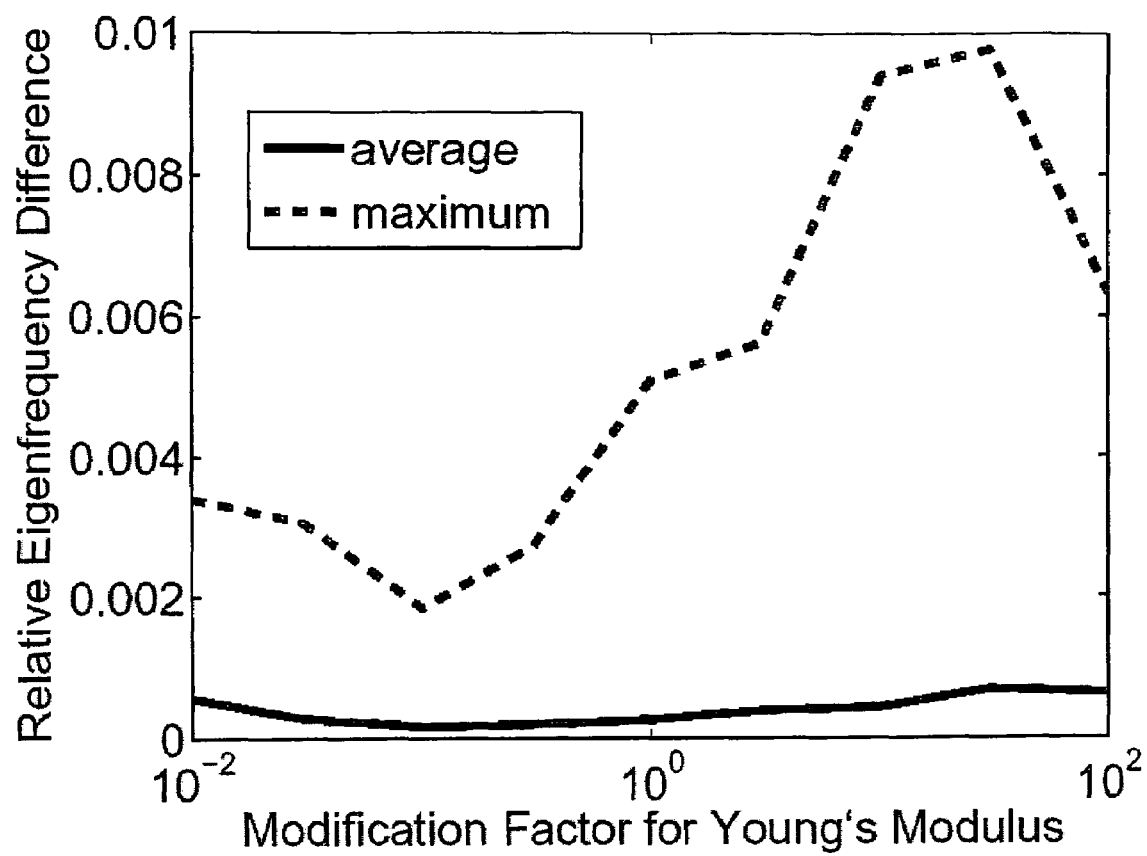
Figure 7E:
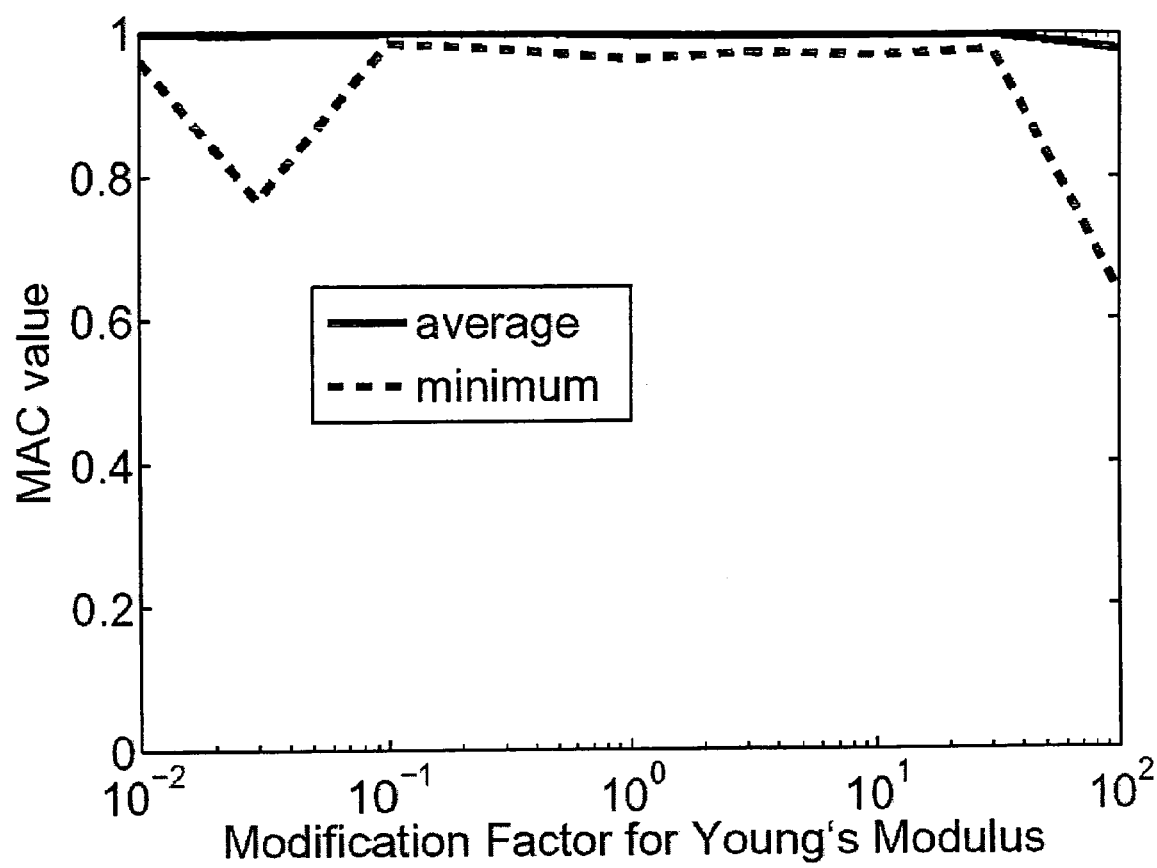
Figure 7F:
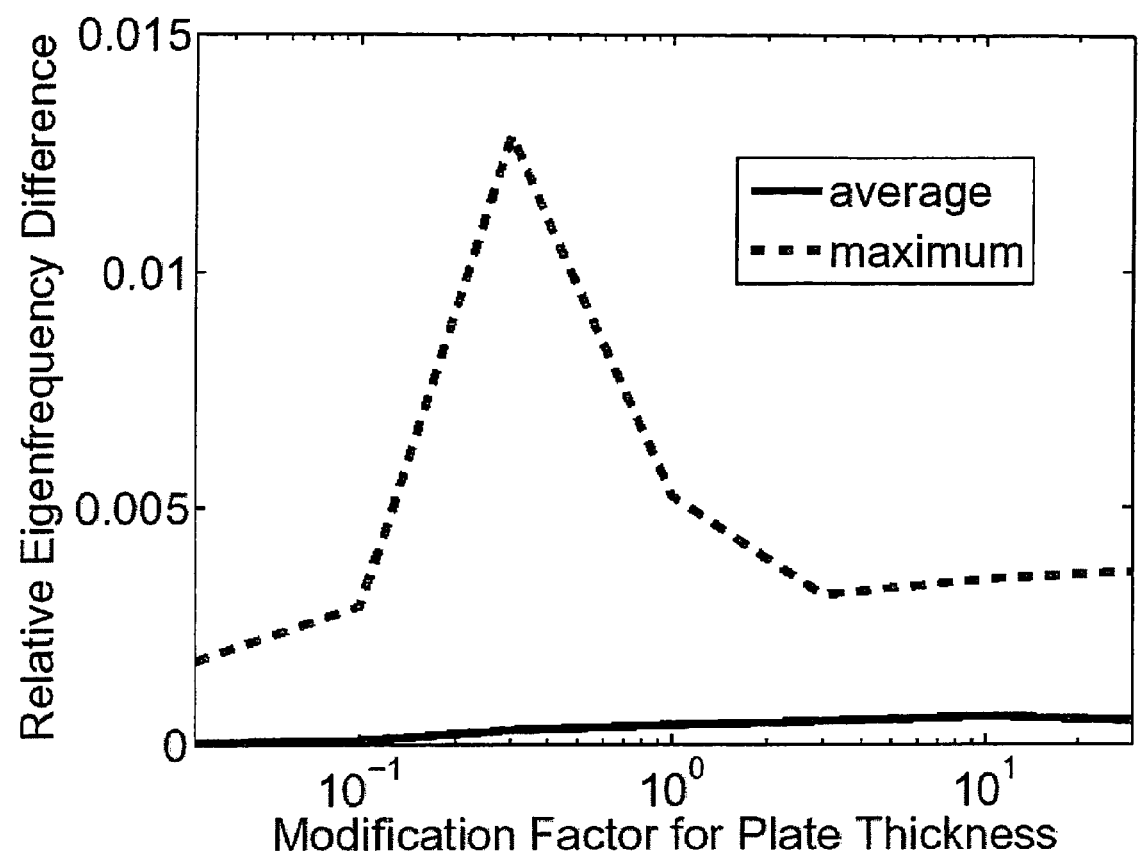
Figure 7G:
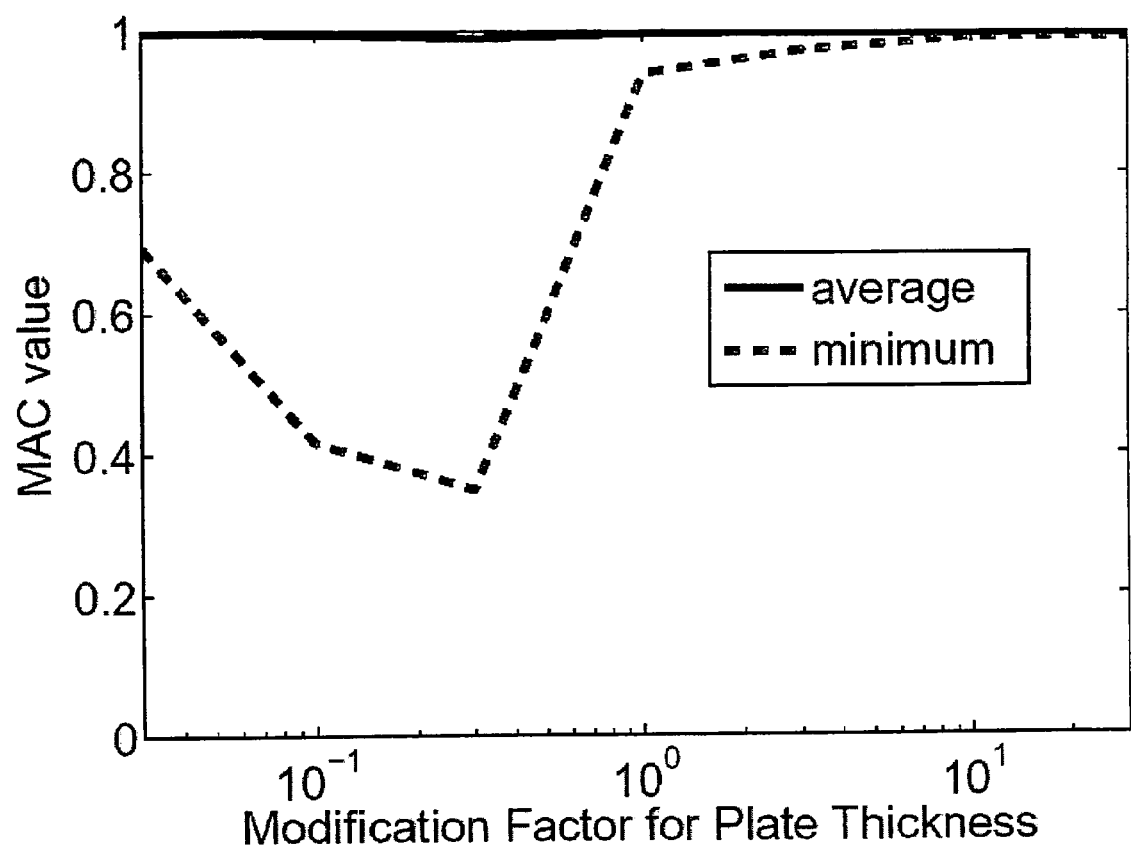

In a further embodiment, the invention relates to a processing system 500 wherein the method embodiments according to the present invention are implemented, or in other words, to a processing system adapted for performing any of the sub-structuring methods according to the present invention. An exemplary processing system 500 is shown in FIG. 10. FIG. 10 shows one configuration of processing system 500 that includes at least one programmable processor 503 coupled to a memory subsystem 505 that includes at least one form of memory, e.g., RAM, ROM, and so forth. A storage subsystem 507 may be included that has at least one disk drive and/or CD-ROM drive and/or DVD drive. In some implementations, a display system, a keyboard, and a pointing device may be included as part of a user interface subsystem 509 to provide for a user to manually input information. Ports for inputting and outputting data also may be included. More elements such as network connections, interfaces to various devices, and so forth, may be included, but are not illustrated in FIG. 10. The various elements of the processing system 500 may be coupled in various ways, including via a bus subsystem 513 shown in FIG. 10 for simplicity as a single bus, but will be understood to those in the art to include a system of at least one bus. The memory of the memory subsystem 505 may at some time hold part or all (in either case shown as 511) of a set of instructions that when executed on the processing system 500 implement the step(s) of the method embodiments for sub-structuring described herein, Thus, while a processing system 500 such as shown in FIG. 10 is prior art, a system that includes the instructions to implement aspects of the present invention is not prior art, and therefore FIG. 10 is not labeled as prior art.

It is to be noted that the processor 503 or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. Furthermore, aspects of the invention can be implemented in a computer program product tangibly embodied in a carrier medium carrying machine-readable code for execution by a programmable processor. Method steps of aspects of the invention may be performed by a programmable processor executing instructions to perform functions of those aspects of the invention, e.g., by operating on input data and generating output data.

Accordingly, the present invention includes a computer program product which provides the functionality of any of the methods according to the present invention when executed on a computing device. Further, the present invention includes a data carrier such as for example a CD-ROM or a diskette which stores the computer product in a machine-readable form and which executes at least one of the methods of the invention when executed on a computing device. Nowadays, such software is often offered on the Internet or a company Intranet for download, hence the present invention includes transmitting the computer product according to the present invention over a local or wide area network. The computing device may include one of a microprocessor and a micro-controller, for instance a programmable digital logic device such as a Programmable Array Logic (PAL), a Programmable Logic Array, a Programmable Gate Array, especially a Field Programmable Gate Array (FPGA).

In particular the present invention includes a computer program product, i.e. software, which contains code that, when executed on a computer system provides a method for performing dynamic analysis of a system, whereby the code, when executed on the computer system provides sub-structuring of said system into a plurality of sub-structures, modelling said sub-structures into sub-structure models and modelling interfaces between said sub-structure models, combining said substructure models at the interfaces into a combined system, solving the combined system, wherein said modelling comprises performing a generalised eigenvector analysis on a discretised model of at least a subassembly of at least two sub-structures. The code can be arranged so that the generalised eigenvector analysis is a normal modes analysis or a complex modes analysis. The code can also be arranged so that said performing a generalised eigenvector analysis comprises obtaining a basis of interface basis functions of said discretised model of at least a subassembly of at least two substructures. The obtaining of a basis of interface basis functions can comprise orthogonalising eigenvectors related to the interfaces between said substructure models, said eigenvectors being eigenvectors of said at least a subassembly of at least two substructures. The obtaining of a basis of interface basis functions can furthermore comprise, after said orthogonalising eigenvectors, selecting a number of orthogonalised eigenvectors that substantially spans the space determined by said eigenvectors related to the interfaces between said substructure models. The code may be adapted so that said dynamic analysis is based on an element-based method, e.g. said element-based method can be a finite element method. Further the code may be adapted so that said dynamic analysis is based on force and/or displacement related quantities. The code may also be adapted so that said dynamic analysis of a system comprises analysis of the vibration and/or acoustical properties of said system. Where at least a subassembly of at least two substructures is mentioned this also comprises the full system.

The code may also be adapted so that modeling said interfaces comprises constraining said substructure interfaces by expressing substructure interface degrees of freedom as linear combination of said interface basis functions-Preferably, the code is also adapted such that prior to said combining, reducing said substructure model is an option. Preferably, the reducing step is facilitated by the use of said basis. For example, the reducing step can involve reduction of the number of degrees of freedom of the substructure model.

The code may also be adapted so that the reducing step utilises enrichment vectors defined by a static or dynamic deformation of a system or model thereof as a consequence of a force excitation and/or an enforced deformation of part of said system.

The present invention also includes a computer program product, e.g. software which comprises code, which when executed on a computer system provides a method for tuning functional characteristics of a physical system, whereby the software has as input a design of said physical system and further comprises code for performing a method for dynamic analysis of said design of said physical system as described above and in addition has code for extracting physical information about the functional characteristics of said design of said physical system. The software may also comprise code for tuning based on altering said design of said physical system using a mathematical model of said altered design of said physical system, said mathematical model at least partly based on said dynamic analysis of said design, and then extracting, from said mathematical model of said altered design of said physical system, physical information about the functional characteristics of said altered design of said physical system. The mathematical model at least partly based on said dynamic analysis of said design can be a mathematical model based on the same generalised eigenvector analysis of said discretised model of at least a subassembly of at least two substructures. The mathematical model at least partly based on said dynamic analysis of said design can be a mathematical model based on the same basis of interface basis functions, In accordance with any of the embodiments of the present invention the system can be a mechanical system, e.g. said functional characteristics of said physical system are vibration and/or acoustic properties of a mechanical system such as an automotive vehicle.

It is an advantage of embodiments of the present invention that they allow speeding up of the calculations, such that the overall calculation time is reduced, In other words the embodiments of the present invention are computational less intensive resulting in either a significant quicker method or system or, if the same computational time is used, a more thorough evaluation of the complex system studied. In conclusion, the efficiency of the methods and systems of the present invention thus is larger. The computational time needed will depend on the computing means that will be used for performing the method, but a gain in speed, e.g. of a factor 10, compared to prior art techniques typically is obtained. The method can be performed on a standard computing means, such as e.g. a state of the art PC. Such a computing means may be any suitable programmable computing device such as personal computer with a Pentium IV microprocessor or a newer model supplied by Intel Corp. USA, for instance, with memory and a graphical interface such as Windows 2000 or Windows XP as supplied by Microsoft Corp. USA.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method for performing dynamic analysis of a physical system, the method comprising obtaining a physical system or a design of a physical system;

translating said physical system or design of a physical system into a mathematical model by causing a computer system programmed to carry out such translation to perform steps of:

sub-structuring said system into a plurality of sub-structures;

modelling said sub-structures into sub-structure models and modelling interfaces between said sub-structure models;

combining said sub-structure models at the interfaces into a combined system;

solving the combined system, wherein said modelling comprises performing a generalized eigenvector analysis on a discretised model of at least a subassembly including at least two said sub-structures;

said computer system presenting results of the translation to a user, to enable such user to determine dynamic properties of said physical system or said design of a physical system.

2. A method according to claim 1, wherein the generalized eigenvector analysis is a normal modes analysis or a complex modes analysis.

3. A method according to claim 1, wherein said performing a generalized eigenvector analysis comprises obtaining a basis of interface basis functions of said discretised model of at least a subassembly of at least two substructures.

4. A method according to claim 3, wherein said obtaining a basis of interface basis functions comprises orthogonalising eigenvectors related to the interfaces between said substructure models, said eigenvectors being eigenvectors of said at least a subassembly of at least two substructures.

5. A method according to claim 4, wherein said obtaining a basis of interface basis functions furthermore comprises, after said orthogonalising eigenvectors, selecting a number of orthogonalised eigenvectors that substantially spans the space determined by said eigenvectors related to the interfaces between said substructure models.

6. A method according to any of the previous claims, wherein said dynamic analysis is based on an element-based method.

7. A method according to claim 6, wherein said element-based method is a finite element method.

8. A method according to 1, wherein said dynamic analysis is based on force and/or displacement related quantities.

9. A method according to claim 1, wherein said dynamic analysis of a system comprises analysis of the vibration and/or acoustical properties of said system.

10. A method according to claim 1, wherein the at least a subassembly of at least two substructures comprises the full system.

11. A method according to claim 3, wherein modelling said interfaces comprises constraining said substructure interfaces by expressing substructure interface degrees of freedom as linear combination of said interface basis functions.

12. A method according to claim 1, wherein the method furthermore comprises, prior to said combining, reducing said substructure model.

13. A method according to claim 12, wherein the reducing step is facilitated by obtaining a basis of interface basis functions of said discretised model.

14. A method of claim 12 wherein the reducing step involves reduction of the number of degrees of freedom of the substructure model.

15. A method according to claim 12, wherein the reducing step comprises the step of using component modes enriched with enrichment vectors to expand substructure degrees of freedom, said enrichment vectors defined by a static or dynamic deformation of a system or model thereof as a consequence of a force excitation and/or an enforced deformation of part of said system.

16. A method for tuning functional characteristics of a physical system, the method comprising
    obtaining by a computer a design of said physical system;
    performing a method for dynamic analysis of said design of said physical system according to claim 1;
    extracting physical information about the functional characteristics of said design of said physical system; and
    using said information for tuning functional characteristics of said physical system.

17. A method according to claim 16, wherein the method for tuning furthermore comprises
    altering said design of said physical system;
    constructing a mathematical model of said altered design of said physical system, said mathematical model at least partly based on said dynamic analysis of said design; and
    extracting, from said mathematical model of said altered design of said physical system, physical information about the functional characteristics of said altered design of said physical system.

18. A method according to claim 17, wherein said mathematical model at least partly based on said dynamic analysis of said design is a mathematical model based on the same generalized eigenvector analysis of said discretised model of at least a subassembly including at least two said substructures.

19. A method according to claim 18, wherein said wherein performing said generalized eigenvector analysis comprises the step of obtaining a basis of interface basis functions of said discretised model.

20. A method according to claim 16, wherein said functional characteristics of said physical system are vibration and/or acoustic properties of said physical system.

21. A method according to claim 1 wherein the system is a mechanical system.

22. A machine-readable data storage device storing a computer program product, said computer program product stored in said machine-readable data storage device including steps for carrying out a method for performing dynamic analysis of a physical system, the method comprising
    obtaining a physical system or a design of a physical system;
    translating said physical system or design of a physical system into a mathematical model by causing a computer, said computer being programmed to carry out such translation, to perform steps of:
        sub-structuring said system into a plurality of sub-structures;
        modelling said sub-structures into sub-structure models and modelling interfaces between said sub-structure models;
        combining said sub-structure models at the interfaces into a combined system;
        solving the combined system,
        wherein said modelling comprises performing a generalized eigenvector analysis on a discretised model of at least a subassembly including at least two said sub-structures;
    enabling presentation of results of the translation to a user, to enable such user to determine dynamic properties of said physical system or said design of a physical system.

23. Transmission of the computer program product of claim 22 over a local or wide area telecommunications network.

24. A computer system for enabling a user to perform dynamic analysis of a physical system, the computer system comprising
    an executable program in a processor of said computer capable of translating said physical system or a design of said physical system into a mathematical model by performing the steps of, when executed:
        sub-structuring of said system into a plurality of sub-structures;
        modelling said sub-structures into sub-structure models and modelling interfaces between said substructure models:
        combining said sub-structure models at the interfaces into a combined system;
        solving the combined system;
        said modelling comprising the step of performing a generalized eigenvector analysis on a discretised model of at least a subassembly of at least two sub-structures,
    said computer system further carrying out the step of presenting results of the translation to a user to enable such user to determine dynamic properties of said physical system or said design of said physical system.

* * * * *